(12) United States Patent
Ohtsuka et al.

(10) Patent No.: US 7,944,000 B2
(45) Date of Patent: May 17, 2011

(54) SEMICONDUCTOR RESISTOR, METHOD OF MANUFACTURING THE SAME, AND CURRENT GENERATING DEVICE USING THE SAME

(75) Inventors: Masaya Ohtsuka, Hyogo-ken (JP); Hiroaki Abe, Kawagoe (JP); Tatsuo Abe, legal representative, Kawagoe (JP)

(73) Assignee: Ricoh Company, Ltd., Tokyo (JP)

( * ) Notice: Subject to any disclaimer, the term of this patent is extended or adjusted under 35 U.S.C. 154(b) by 64 days.

(21) Appl. No.: 11/811,860

(22) Filed: Jun. 11, 2007

(65) Prior Publication Data

US 2008/0030297 A1 Feb. 7, 2008

(30) Foreign Application Priority Data

Jun. 12, 2006 (JP) ................................. 2006-162022

(51) Int. Cl.
H01L 21/70 (2006.01)
(52) U.S. Cl. ...................................... 257/375; 257/344
(58) Field of Classification Search .................. 438/514; 257/375
See application file for complete search history.

(56) References Cited

U.S. PATENT DOCUMENTS

| | | | | |
|---|---|---|---|---|
| 6,221,681 | B1 * | 4/2001 | Sugasawara | 438/14 |
| 6,784,490 | B1 * | 8/2004 | Inoue et al. | 257/344 |
| 6,921,946 | B2 * | 7/2005 | Tao et al. | 257/355 |

FOREIGN PATENT DOCUMENTS

| | | |
|---|---|---|
| JP | 8-97418 | 4/1996 |
| JP | 2000-31269 | 1/2000 |
| JP | 2001-217393 | 8/2001 |

\* cited by examiner

*Primary Examiner* — Thanh V Pham
*Assistant Examiner* — Tony Tran
(74) *Attorney, Agent, or Firm* — Cooper & Dunham LLP

(57) ABSTRACT

A method for manufacturing a semiconductor resistor includes forming a well region in a semiconductor substrate, with the well region serving as a resistive region, forming a pair of contact regions spaced apart from each other in the well region, and forming a diffusion region in an intermediate portion between the pair of contact regions on a surface of the well region. The diffusion region is configured to adjust resistance and temperature dependence of the semiconductor resistor.

19 Claims, 20 Drawing Sheets

SEMICONDUCTOR RESISTOR, METHOD OF MANUFACTURING THE SAME, AND CURRENT GENERATING DEVICE USING THE SAME

TECHNICAL FIELD

The present disclosure relates to a semiconductor resistor and a method of manufacturing the semiconductor resistor having a well region with resistance and temperature dependence adjustable using an additional diffusion region, and a current generating device using the semiconductor resistor.

DISCUSSION OF THE BACKGROUND

Recent developments in semiconductor technology enable semiconductor devices with reduced size gate electrodes to be obtained, which results in an increase in digital calculation speed. Semiconductor devices are increasingly used in analog circuits, such as power supply circuits, as well as in digital circuits.

Characteristics of an analog circuit having semiconductor devices are significantly affected by variations in physical properties of the semiconductor devices, such as resistance, capacitance, and dependence on temperature and voltage.

In particular, variations in temperature dependence of semiconductor devices used in circuitry may cause undesired effects on the circuitry, which are typically negligible for a digital circuit, but cannot be ignored for an analog circuit.

Thus, temperature dependence of semiconductor devices in analog circuitry needs to be leveled.

An approach to reduce the variations in temperature dependence is to design the analog circuitry so that temperature coefficients of semiconductor devices cancel each other out.

Referring to FIG. 1, a diagram showing a constant current circuit 90' including semiconductor devices of different temperature dependence is described.

In FIG. 1, the constant current circuit 90' includes a power supply terminal 38, an operational amplifier 44 (hereinafter referred to as "op-amp 44"), metal-oxide semiconductor (MOS) transistors M1, M2, and M3, bipolar transistors Q1 and Q2, and a resistor X1.

The MOS transistors M1 through M3 have identical characteristics, and are connected as a current mirror. The MOS transistors M1 through M3 have sources connected to a supply circuit (not shown) via the power supply terminal 38.

The MOS transistor M1 is grounded via the bipolar transistor Q1. The MOS transistor M2 is grounded via the resistor X1 and the bipolar transistor Q2.

The bipolar transistors Q1 and Q2 are basically identical in characteristics, except for different base-emitter junction areas. The ratio of the base-emitter junction area of the bipolar transistor Q1 to that of Q2 is defined as 1:n (n>1). Each of the MOS transistors Q1 and Q2 has a base and a collector grounded.

The op-amp 44 has a negative, inverting input terminal and a positive, non-inverting input terminal. The inverting input terminal receives an input of electric potential derived from a base-emitter voltage $V_{BE1}$ of the bipolar transistor Q1. The non-inverting input terminal receives an input of electric potential derived from a base-emitter voltage $V_{BE2}$ of the bipolar transistor Q2 and a voltage $\Delta V_{BE}$ applied across the resistor X'.

In the constant current circuit 90', negative feedback is applied so that the input voltage to the non-inverting input terminal and the input voltage to the inverting input terminal are substantially equal. Due to the negative feedback, the voltage $\Delta V_{BE}$ has a potential substantially equal to a difference between the base-emitter voltage $V_{BE1}$ and the base-emitter voltage $V_{BE2}$.

The MOS transistors M1 through M3 have a common drain current substantially equal to a reference current I. The bipolar transistor Q2 has a saturation current $I_{s2}$ which is n times as large as a saturation current $I_{s1}$ of the bipolar transistor Q1. Each of the bipolar transistors Q1 and Q2 has an emitter biased with a common current $I_0$.

Consequently, the voltage $\Delta V_{BE}$ applied across the resistor X' is represented by the following equation:

$$\Delta V_{BE} = V_{BE1} - V_{BE2} \qquad \text{Equation [1]}$$
$$= V_t * \ln(I_0/I_{s1}) - V_t * \ln(I_0/I_{s2})$$
$$= V_t * \ln(n),$$

where $V_t$ is thermal voltage given by kT/q with absolute temperature T (K), Boltzmann constant k=1.38*10$^{-13}$ (J/K), and elementary charge q=1.6*10$^{-19}$ (C).

As the right-hand side of the Equation [1] is equal to I*R with R denoting the resistance of the resistor X', the reference current I is represented as $V_t$*ln(n)/R. Consequently, the temperature coefficient TC(I) of the reference current I is represented by the following equation:

$$TC(I) = 1/I * \partial I/\partial T \qquad \text{Equation [2]}$$
$$= TC(V_t) + TC(1/R)$$
$$= TC(V_t) - TC(R).$$

Given that the reference temperature T=300 (K), the value of TC($V_t$) is 3333 ppm/° C. According to Equation [2], the temperature coefficient TC(I) of the reference current I can be reduced to 0 by adjusting the temperature coefficient TC(R) of the resistor X' to be 3333 ppm/° C.

The temperature coefficient TC(R) of the resistor X' is given by the following equation:

$$TC(R)=(R_T-R_{RT})/R_{RT} \qquad \text{Equation [3],}$$

where $R_T$ represents a resistance value at the reference temperature T and $R_{RT}$ represents a resistance value at room temperature, i.e., 25° C.

The resistor X' in the constant current circuit 90' may be configured as a semiconductor device having N-well and/or P-well regions.

Referring to FIGS. 2A and 2B, a schematic illustration of a background art semiconductor device 100 is described. FIG. 2A shows a plan view of the semiconductor device 100. FIG. 2B shows a cross-sectional view of the semiconductor device 100 taken along line F-F of FIG. 2A.

The semiconductor device 100 includes a substrate 102, a pair of side portions 103a and 103b, an N-well 104, and an isolation layer 112.

Each of the side portions 103a and 103b includes a contact region 106, a silicide layer 108, and a pair of contacts 110a and 110b.

The N-well 104 is formed at a main surface of the substrate 102. The contact region 106 is an N$^+$ region, disposed substantially at each end of the N-well 104. The silicide layer 108 is disposed on the contact region 106. The pair of contacts 110a and 110b are formed on the silicide layer 108.

The semiconductor device 100 has a shallow trench isolation (STI) structure. The N-well 104 is electrically isolated by the isolation layer 112 formed of silicon dioxide, which is deposited over the N-well 104 and the substrate 102 except for areas corresponding to the contact region 106.

In the semiconductor device 100, the N-well 104 exhibits a resistance which can be controlled by varying the size of the N-well 104.

For example, in prototype testing stage for the semiconductor device 100, the size of the N-well 104 is varied by altering the length and width of the N-well 104.

As the manufacture of the semiconductor device 100 involves lithography processes, in which the N-well 104 and other components, such as the contact region 106 and the pair of contacts 110a and 110b, are formed using photoresist masks, altering the length and width of the N-well 104 results in a need to replace patterns of the photoresist masks for the N-well 104 as well as other neighboring components.

The resistance of the N-well 104 can also be controlled by varying the depth of the N-well 104. In a background art fabrication process, the resistance of the N-well 104 is reduced by forming the isolation layer 112 so that the N-well 104 has a relatively large depth. Such a process is effective in reducing a substrate bias, but does not provide a solution to control the temperature dependence of the resistance.

To control the temperature dependence of resistance of the semiconductor device 100, a method has been proposed in which the thermal property of the resistance derived from the N-well 104 is corrected by introducing another resistive element of different thermal property. However, accurate control of the temperature dependence of resistance is difficult due to variations in producing the different types of resistive elements.

BRIEF SUMMARY

This patent specification describes a novel method for manufacturing a semiconductor resistor having a well region with resistance and temperature dependence adjustable using an additional diffusion region.

In one example, a novel method for manufacturing a semiconductor resistor includes forming a well region in a semiconductor substrate, with the well region serving as a resistive region, forming a pair of contact regions spaced apart from each other in the well region, and forming a diffusion region in an intermediate portion between the pair of contact regions on a surface of the well region. The diffusion region is configured to adjust resistance and temperature dependence of the semiconductor resistor.

This patent specification further describes a novel semiconductor resistor having a well region with resistance and temperature dependence adjustable using an additional diffusion region.

In one example, a semiconductor resistor includes a semiconductor substrate, a well region, a pair of contact regions, a contact and a diffusion region. The well region is configured to serve as a resistive region provided in the semiconductor substrate. The pair of contact regions are spaced apart from each other in the well region. The contact is disposed on each of the pair of contact regions. The diffusion region is configured to adjust resistance and temperature dependence of the semiconductor resistor. The diffusion region is formed in an intermediate portion between the pair of contact regions on a surface of the well region.

This patent specification further describes a novel current generating device including a semiconductor resistor having a well region with resistance and temperature dependence adjustable using an additional diffusion region.

In one example, a novel current generating device includes a voltage generating part, a semiconductor resistor, and a current output part. The voltage generating part is configured to generate a voltage having a specific dependency on temperature variations. The semiconductor resistor is configured to receive the generated voltage at each end thereof. The current output part is configured to output a current in accordance with thermal properties of the generated voltage and the semiconductor resistor.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
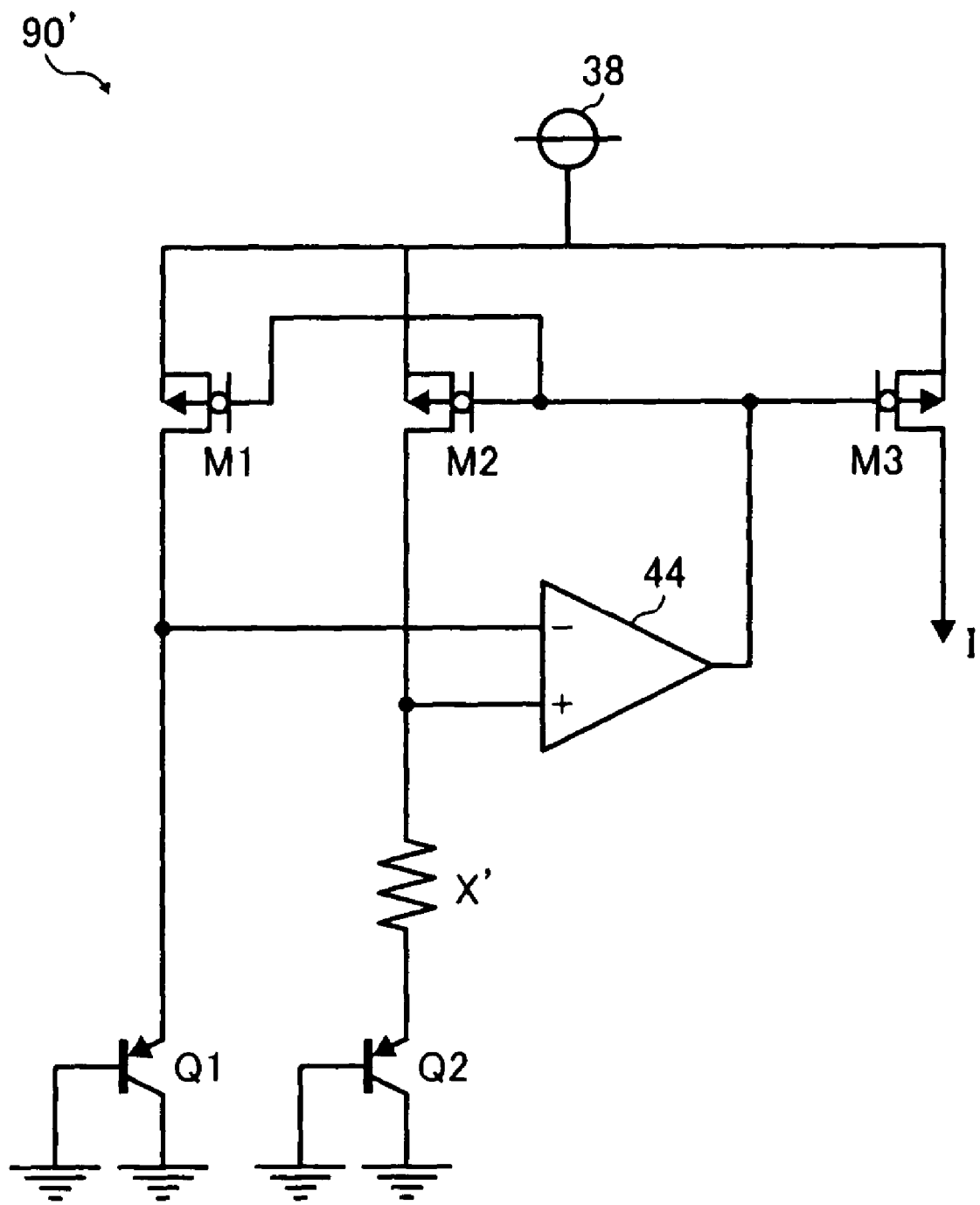
FIG. 1 is a diagram showing a constant current circuit including semiconductor devices of different temperature dependence.
Figure 2A:
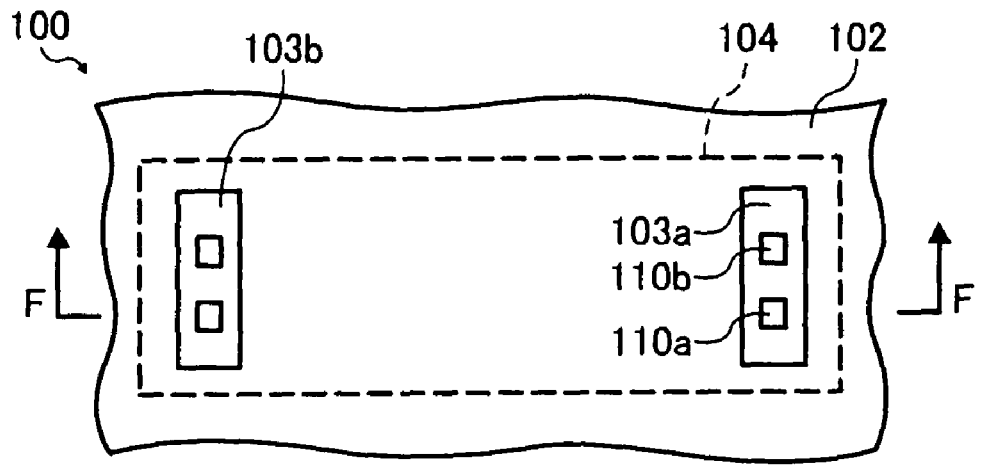
FIG. 2A is a plan view of a background art semiconductor device included in the circuit of FIG. 1.
Figure 2B:
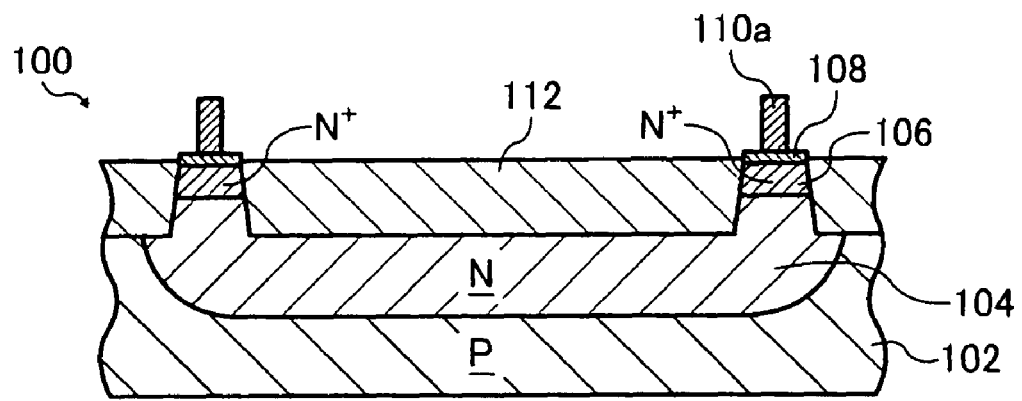
FIG. 2B is a cross-sectional view of the background art semiconductor device included in the circuit of FIG. 1, taken along line F-F of FIG. 2A.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referring now to the drawings, wherein like reference numerals designate identical or corresponding parts throughout the several views, exemplary embodiments of this disclosure are described.

Figure 3A:
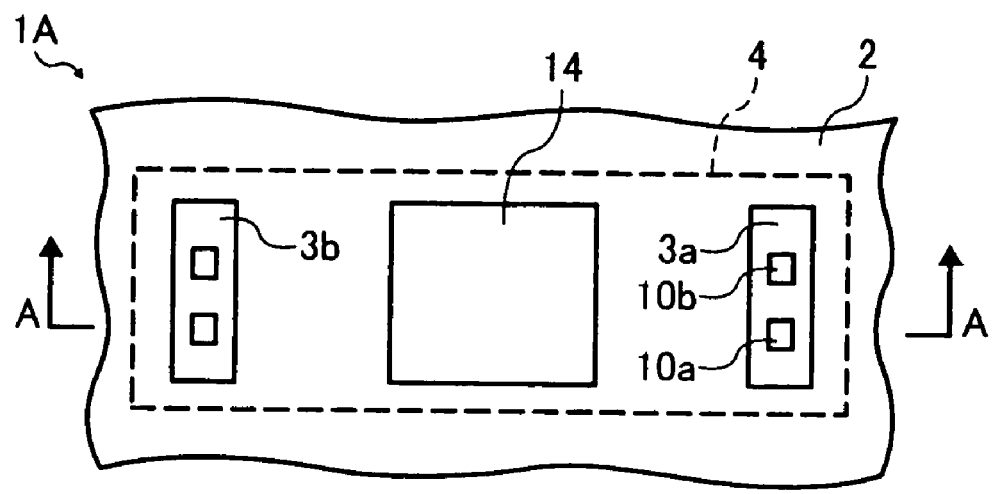
FIG. 3A is a plan view of a semiconductor device according to an exemplary embodiment of this disclosure.
Figure 3B:
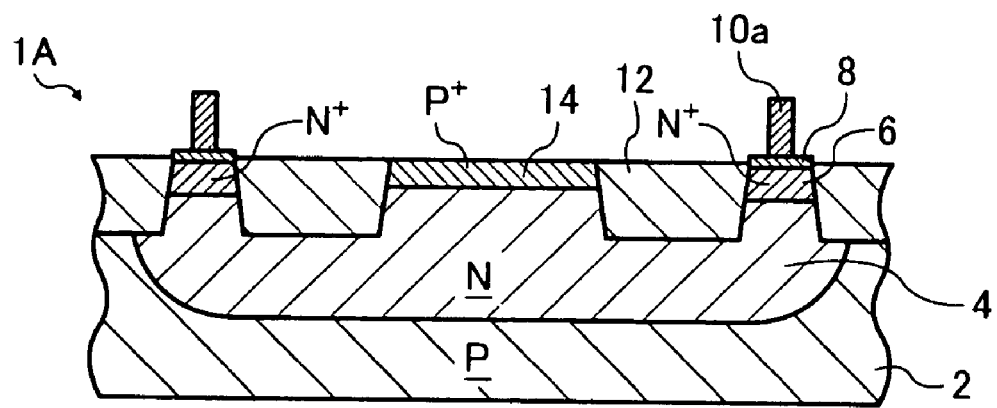
FIG. 3B is a cross-sectional view of the semiconductor device taken along line A-A of FIG. 3A.

Referring to FIGS. 3A and 3B of the drawings, a semiconductor device 1A according to an exemplary embodiment of the present specification is described. FIG. 3A shows a plan view of the semiconductor device 1A. FIG. 3B shows a cross-sectional view of the semiconductor device 1A taken along line A-A of FIG. 3A.

In FIGS. 3A and 3B, the semiconductor device 1A includes a substrate 2, a resistive region 4, and an isolation layer 12.

The resistive region 4 includes a pair of side portions 3a and 3b and a diffusion region 14. Each of the side portions 3a and 3b includes a contact region 6, a silicide layer 8, and a pair of contacts 10a and 10b.

In the semiconductor device 1A, the substrate 2 is P-type, and the resistive region 4 is an N-well formed below a surface of the P-type substrate 2.

Each of the side portions 3a and 3b is disposed adjacent to an end of the resistive region 4, spaced from each other. The contact region 6 is an N$^+$ region. The pair of contacts 10a and 10b are formed of tungsten, for example, and disposed at the contact region 6 with the silicide layer 8 sandwiched therebetween.

The diffusion region 14 is a P$^+$ region formed between the pair of side portions 3a and 3b.

The semiconductor device 1A has a shallow trench isolation (STI) structure. Namely, the resistive region 4 is electrically isolated by the isolation layer 12 formed of silicon dioxide, which is deposited over the resistive region 4 and the substrate 2 except for areas corresponding to the pair of side portions 3a and 3b and the diffusion region 14. Alternatively, the isolation layer 12 may be formed by local oxidation of silicon (LOCOS).

In the semiconductor device 1A, the diffusion region 14, which is formed between the pair of side portions 3a and 3b, has a conductivity type opposite to the resistive region 4. Providing the diffusion region 14 causes a reduction in resistance exhibited by the semiconductor device 1A. The resistance of the semiconductor device 1A is adjusted by varying the proportion of the diffusion region 14 in the resistive region 4.

Further, providing the diffusion region 14 also results in an increase in temperature dependence of the resistance of the resistive region 4. The temperature dependence of the resistance of the semiconductor device 1A is also adjusted by varying the proportion of the diffusion region 14 in the resistive region 4.

Figure 4:
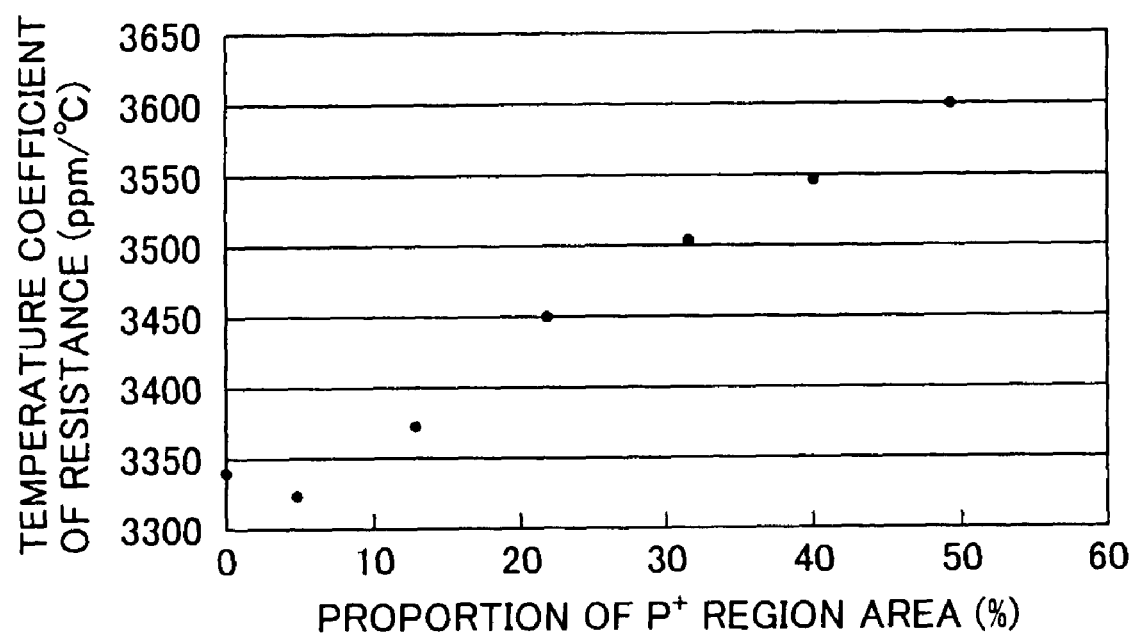
FIG. 4 is a plot showing a correlation between the relative proportion of a $P^+$ diffusion region and temperature dependence of resistance of the semiconductor device of FIGS. 3A and 3B.

Referring to FIG. 4, a plot showing a correlation between the relative proportion of the P$^+$ diffusion region 14 and the temperature dependence of resistance of the semiconductor device 1A is described.

In FIG. 4, the vertical axis represents temperature coefficient of resistance (ppm/° C.) of the semiconductor device 1A and the horizontal axis represents proportion of the surface area of the P$^+$ diffusion region (%) in the surface area of the N-well.

As shown in the chart of FIG. 4, the temperature coefficient of resistance, which indicates the temperature dependence of resistance of the semiconductor device 1A, is positively correlated with the proportion of the surface area of the diffusion region 14 in the resistive region 4.

For example, when the proportion of P$^+$ diffusion region area is 0%, i.e., the diffusion region 14 is not provided, the temperature coefficient of resistance is approximately 3350 ppm/° C. The temperature coefficient of resistance increases to approximately 3600 ppm/° C. when the diffusion region 14 is formed with a surface area of 50% of the resistive region 4.

Consequently, the temperature dependence of the semiconductor device 1A can be increased by increasing the proportion of the surface area of the diffusion region 14, and vice versa.

Referring now to FIGS. 5A through 5H, a fabrication process of the semiconductor device 1A according to an exemplary embodiment of this disclosure is described.

The fabrication process of the semiconductor device 1A includes steps S101 through S108. FIGS. 5A through 5H illustrate the structure resulting from the steps S101 through S108, respectively.

Figure 5A:
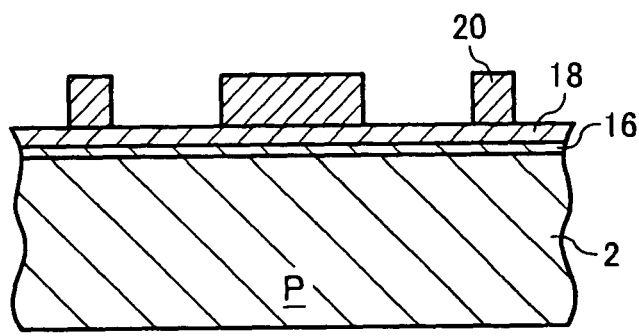
FIGS. 5A through 5H are cross-sectional views showing fabrication process of the semiconductor device of FIGS. 3A and 3B according to an exemplary embodiment of the present invention.

With reference to FIG. 5A, in step S101, a silicon dioxide film 16 and a silicon nitride film 18 are formed over a main surface of the substrate 2. Then, an etch mask 20 such as photoresist is applied to the silicon nitride film 18 and patterned using a photolithographic technique to create a window.

Figure 5B:
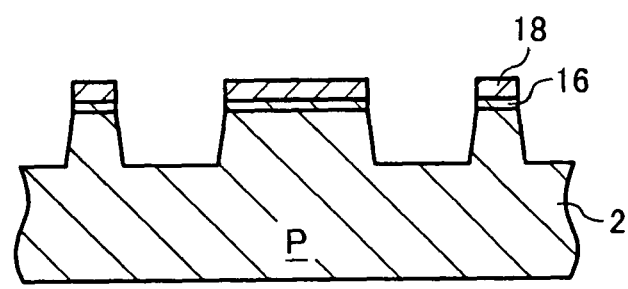

With reference to FIG. 5B, in step S102, a rectangular cavity of a given depth is then formed in the substrate 2 by a dry etching technique. The etch mask 20 is subsequently removed.

Figure 5C:
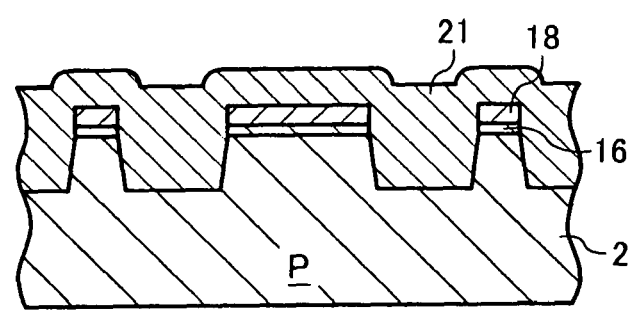

With reference to FIG. 5C, in step S103, the rectangular cavity is filled with a silicon dioxide material 21 by chemical vapor deposition (CVD).

Figure 5D:
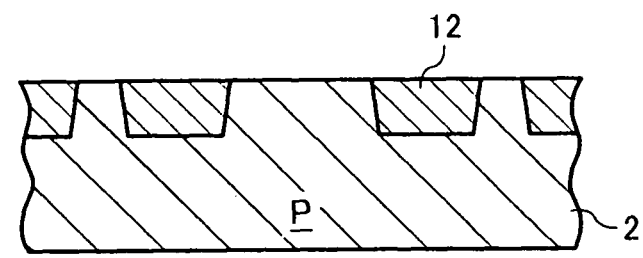

With reference to FIG. 5D, in step S104, the substrate 2 is planarized, for example, by chemical mechanical polishing (CMP) to form the isolation layer 12 in the rectangular cavity.

Figure 5E:
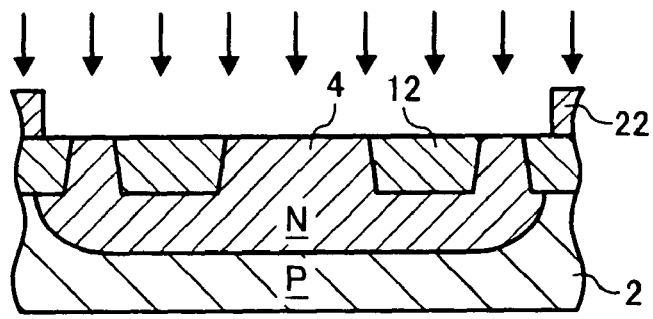

With reference to FIG. 5E, in step S105, a photoresist mask 22 is applied to the substrate 2 and patterned using a photolithographic technique. Then, phosphorus ions are implanted in the substrate 2 at a portion not covered with the photoresist mask 22. The implantation is performed with an energy of 490 KeV and a dose of $2*10^{13}$ A/cm$^2$, for example. The photoresist mask 22 is subsequently removed, and the N-type resistive region 4 is formed by heat treatment.

Figure 5F:
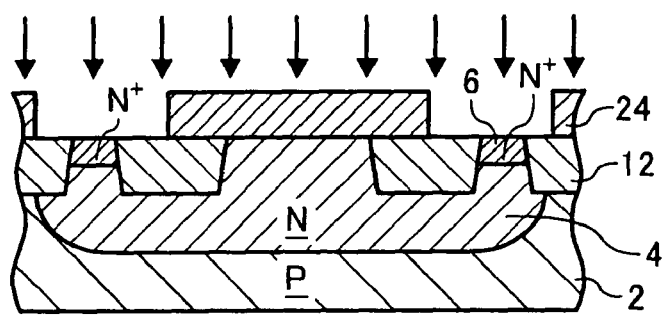

With reference to FIG. 5F, in step S106, a photoresist mask 24 is applied to the substrate 2 and patterned using a photolithographic technique. Then, arsenic ions are implanted in the substrate 2 at a portion not covered with the photoresist mask 24. The implantation is performed with an energy of 60 KeV and a dose of $4*10^{15}$ A/cm$^2$, for example. The photoresist mask 24 is subsequently removed, and the N$^+$ contact region 6 is formed by heat treatment at each end of the resistive region 4.

Figure 5G:
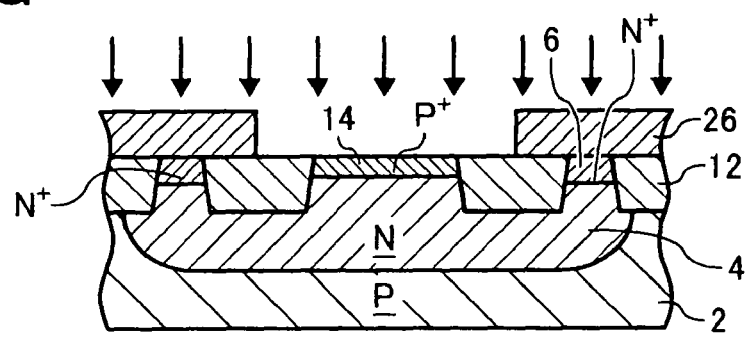

With reference to FIG. 5G, in step S107, a photoresist mask 26 is applied to the substrate 2 and patterned using a photolithographic technique. Then, dopant ions, e.g., boron ions are implanted in the substrate 2 at a portion not covered with the photoresist mask 26. The implantation is performed with an energy of 5 KeV and a dose of $2.5*10^5$ A/cm$^2$, for example.

Figure 5H:
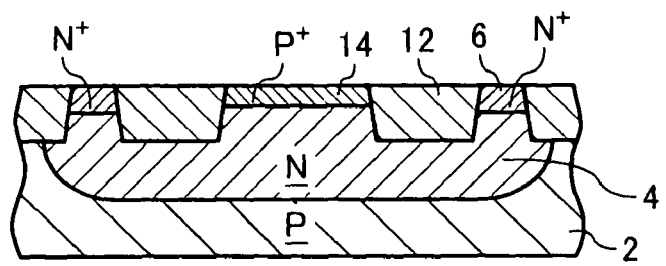

With reference to FIG. 5H, in step S108, the photoresist mask 26 is subsequently removed, and the P$^+$ diffusion region 14 is formed by heat treatment between the ends of the resistive region 4.

Afterwards, the silicide layer 8 and the pair of contacts 10$a$ and 10$b$ are disposed on the contact region 6 to obtain the semiconductor device 1A of FIGS. 3A and 3B.

Some steps of the above fabrication process may be performed in tandem with processing of different components than the semiconductor device 1A. For example, the ion implantation of steps S106 and/or S107 may be performed in introducing ions to form a source and/or a drain of another component formed on the substrate 2, such as a transistor. Thereby, the above fabrication process can be performed without involving additional stages to an existing fabrication process of a semiconductor device.

Additionally, in the above fabrication process, the isolation layer 12 may be produced by using a LOCOS technique instead of forming the STI structure using the CVD and CMP processes. However, the STI structure is preferable in order to make sure the dopant ions implanted after the formation of the isolation layer 12 (i.e., dopant ions for the contact region 6 and the P$^+$ diffusion region 14) are prevented from diffusing outward from a desired portion in the substrate 2.

Figure 6A:
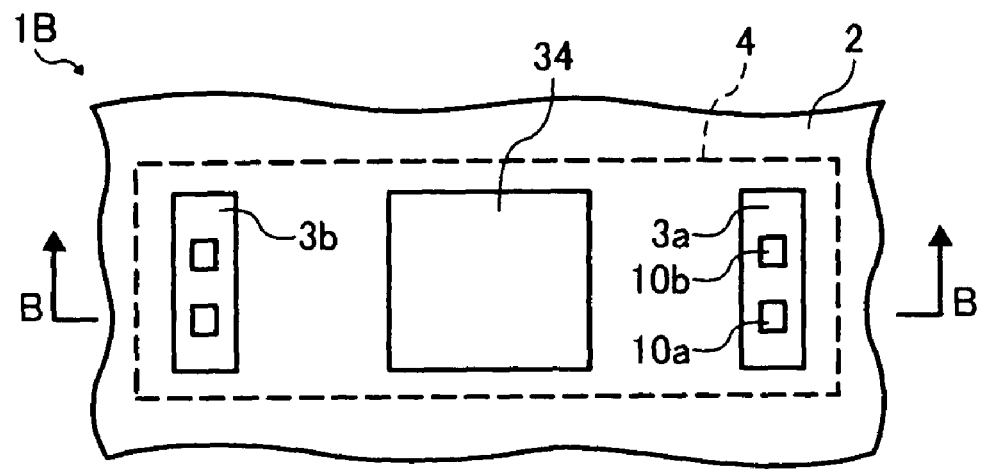
FIG. 6A is a plan view of a semiconductor device according to another exemplary embodiment.
Figure 6B:
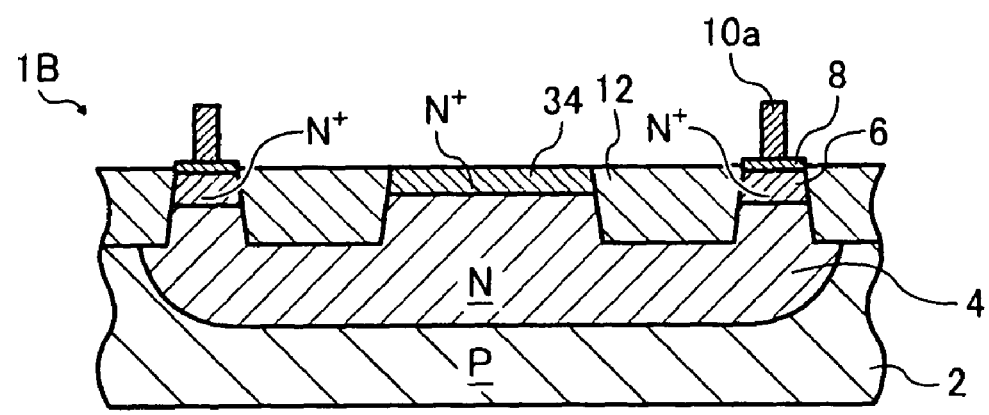
FIG. 6B is a cross-sectional view of the semiconductor device of FIG. 6A, taken along line B-B of FIG. 6A.

Referring now to FIGS. 6A and 6B of the drawings, a semiconductor device 1B according to another exemplary embodiment is described. FIG. 6A shows a plan view of the semiconductor device 1B. FIG. 6B shows a cross-sectional view of the semiconductor device 1B taken along line B-B of FIG. 6A.

In FIGS. 6A and 6B, the semiconductor device 1B includes the substrate 2, the resistive region 4, and the isolation layer 12.

The resistive region 4 includes the pair of side portions 3$a$ and 3$b$, and a diffusion region 34. Each of the side portions 3$a$ and 3$b$ includes the contact region 6, the silicide layer 8, and the pair of contacts 10$a$ and 10$b$.

In the semiconductor device 1B, the substrate 2 is P-type, and the resistive region 4 is an N-well formed below a surface of the P-type substrate 2.

Each of the pair of side portions 3$a$ and 3$b$ is disposed adjacent to an end of the resistive region 4, spaced from each other. The contact region 6 is an N$^+$ region. The pair of contacts 10$a$ and 10$b$ are formed of tungsten, for example, and disposed at the contact region 6 with the silicide layer 8 sandwiched therebetween.

The diffusion region 34 is an N$^+$ region formed between the pair of side portions 3$a$ and 3$b$.

The semiconductor device 1B has an STI structure. Namely, the resistive region 4 is electrically isolated by the isolation layer 12 formed of silicon dioxide, which is deposited over the resistive region 4 and the substrate 2 except for areas corresponding to the pair of side portions 3$a$ and 3$b$ and the diffusion region 34. Alternatively, the isolation layer 12 may be formed by a LOCOS technique.

In the semiconductor device 1B, the diffusion region 34, which is formed between the pair of side portions 3$a$ and 3$b$, has a conductivity type same as the resistive region 4. Providing the diffusion region 34 causes a reduction in resistance exhibited by the semiconductor device 1B. The resistance of the semiconductor device 1B is adjusted by varying the proportion of the diffusion region 34 in the resistive region 4.

Additionally, compared to the P$^+$ diffusion region 14, the N$^+$ diffusion region 34 is more effective in reducing the resistance of the N-type resistive region 4.

Further, providing the diffusion region 34 also results in an increase in temperature dependence of the resistance of the resistive region 4. The temperature dependence of the resistance of the semiconductor device 1B is also adjusted by varying the proportion of the diffusion region 34 in the resistive region 4.

Specifically, the temperature dependence of the semiconductor device 1B can be increased by increasing the proportion of the surface area of the diffusion region 34, and vice versa.

Figure 7A:
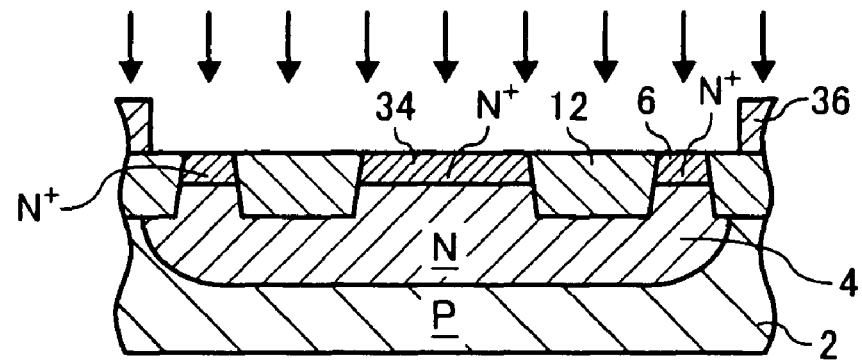
FIGS. 7A and 7B are cross-sectional views showing fabrication process of the semiconductor device of FIGS. 6A and 6B.
Figure 7B:
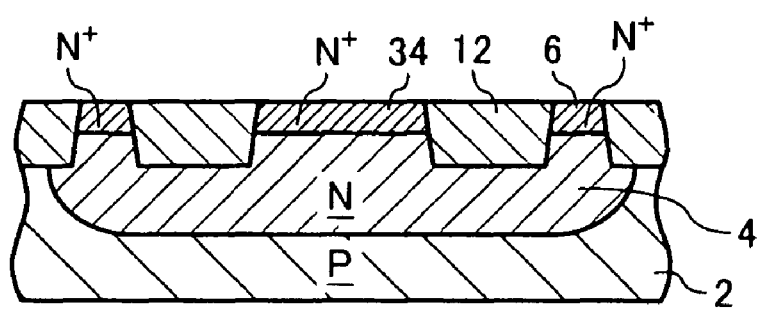

Referring now to FIGS. 7A through 7B, a fabrication process of the semiconductor device 1B according to another exemplary embodiment is described.

The fabrication process of the semiconductor device 1B includes steps S201 through S207. FIGS. 7A and 7B illustrate the structure resulting from the steps S206 and S207, respectively. The steps S201 through S205 are performed in a similar manner as the steps S101 through S105 illustrated in FIGS. 5A through 5E.

With reference to FIG. 5A, in step S201, a silicon dioxide film 16 and a silicon nitride film 18 are formed over a main surface of the substrate 2. Then, an etch mask 20 such as photoresist is applied to the silicon nitride film 18 and patterned using a photolithographic technique to create a window.

With reference to FIG. 5B, in step S202, a rectangular cavity of a given depth is then formed in the substrate 2 by a dry etching technique. The etch mask 20 is subsequently removed.

With reference to FIG. 5C, in step S203, the rectangular cavity is filled with a silicon dioxide material 21 by a CVD process.

With reference to FIG. 5D, in step S204, the substrate 2 is planarized, for example, by a CMP process to form the isolation layer 12 in the rectangular cavity.

With reference to FIG. 5E, in step S205, a photoresist mask 22 is applied to the substrate 2 and patterned using a photolithographic technique. Then, phosphorus ions are implanted in the substrate 2 at a portion not covered with the photoresist mask 22. The implantation is performed with an energy of 490 KeV and a dose of $2*10^{13}$ A/cm$^2$, for example. The photoresist mask 22 is subsequently removed, and the N-type resistive region 4 is formed by heat treatment.

With reference to FIG. 7A, in step S206, a photoresist mask 36 is applied to the substrate 2 and patterned using a photolithographic technique. Then, arsenic ions are implanted in the substrate 2 at a portion not covered with the photoresist mask 36. The implantation is performed with an energy of 60 KeV and a dose of $4*10^{15}$ A/cm$^2$, for example.

With reference to FIG. 7B, in step S207, the photoresist mask 36 is subsequently removed. By performing heat treatment, the N$^+$ contact region 6 is formed at each end of the resistive region 4 and the N$^+$ diffusion region 34 is formed between the ends of the resistive region 4.

Afterwards, the silicide layer 8 and the pair of contacts 10a and 10b are disposed on the contact region 6 to obtain the semiconductor device 1B of FIGS. 6A and 6B.

Additionally, in the above fabrication process, the isolation layer 12 may be produced by using a LOCOS technique instead of forming the STI structure using the CVD and CMP processes. However, the STI structure is preferable in order to make sure the dopant ions implanted after the formation of the isolation layer 12 (i.e., dopant ions for the contact region 6 and the N$^+$ diffusion region 34) are prevented from diffusing outward from a desired portion in the substrate 2.

Figure 8A:
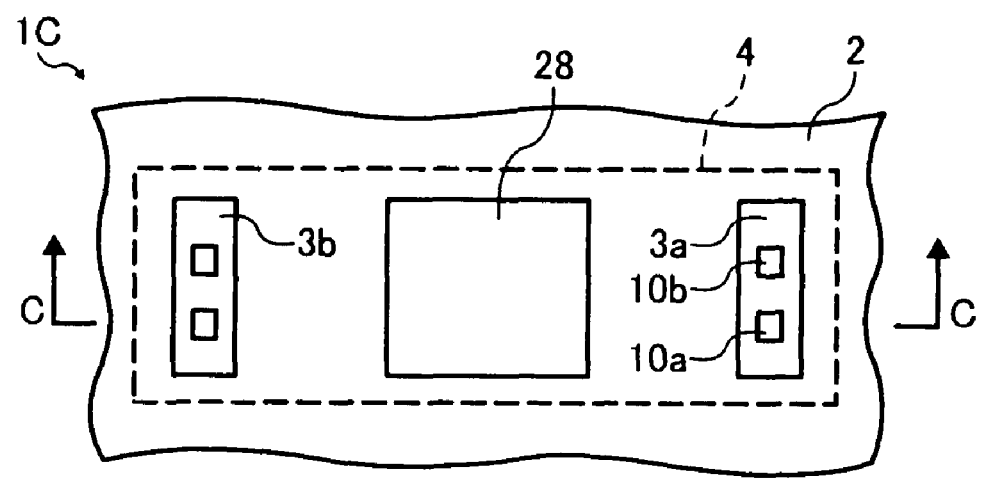
FIG. 8A is a plan view of a semiconductor device according to another exemplary embodiment.
Figure 8B:
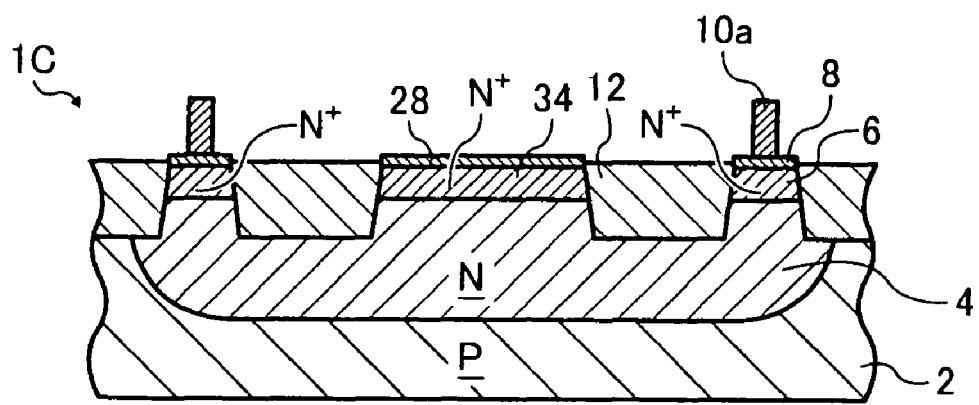
FIG. 8B is a cross-sectional view of the semiconductor device of FIG. 8A taken along line C-C of FIG. 8A.

Referring now to FIGS. 8A and 8B of the drawings, a semiconductor device 1C according to another exemplary embodiment is described. FIG. 8A shows a plan view of the semiconductor device 1C. FIG. 8B shows a cross-sectional view of the semiconductor device 1C taken along line C-C of FIG. 8A.

In FIGS. 8A and 8B, the semiconductor device 1C includes the substrate 2, the resistive region 4, and the isolation layer 12.

The resistive region 4 includes the pair of side portions 3a and 3b, the diffusion region 34, and a silicide layer 28. Each of the side portions 3a and 3b includes the contact region 6, the silicide layer 8, and the pair of contacts 10a and 10b.

In the semiconductor device 1C, the substrate 2 is P-type, and the resistive region 4 is an N-well formed below a surface of the P-type substrate 2.

Each of the pair of side portions 3a and 3b is disposed adjacent to an end of the resistive region 4, spaced from each other. The contact region 6 is an N$^+$ region. The pair of contacts 10a and 10b are formed of tungsten, for example, and disposed at the contact region 6 with the silicide layer 8 sandwiched therebetween.

The diffusion region 34 is an N$^+$ region formed between the pair of side portions 3a and 3b. A surface of the diffusion region 34 is covered with the silicide layer 28. The silicide layer 28 is formed by a reaction of silicon with cobalt, for example.

The semiconductor device 1C has an STI structure. Namely, the resistive region 4 is electrically isolated by the isolation layer 12 formed of silicon dioxide, which is deposited over the resistive region 4 and the substrate 2 except for areas corresponding to the pair of side portions 3a and 3b and the diffusion region 34. Alternatively, the isolation layer 12 may be formed by a LOCOS technique.

In the semiconductor device 1C, the diffusion region 34, which is formed between the pair of side portions 3a and 3b, has a conductivity type same as the resistive region 4. Providing the diffusion region 34 causes a reduction in resistance exhibited by the semiconductor device 1C. The resistance of the semiconductor device 1C is adjusted by varying the proportion of the diffusion region 34 in the resistive region 4.

Additionally, compared to the P$^+$ diffusion region 14, the N$^+$ diffusion region 34 is more effective in reducing the resistance of the N-type resistive region 4.

Further, providing the diffusion region 34 also results in an increase in temperature dependence of the resistance of the resistive region 4. The temperature dependence of the resistance of the semiconductor device 1C is also adjusted by varying the proportion of the diffusion region 34 in the resistive region 4.

Specifically, the temperature dependence of the semiconductor device 1C can be increased by increasing the proportion of the surface area of the diffusion region 34, and vice versa.

In addition, the resistance of the semiconductor device 1C is further reduced by providing the silicide layer 28 on the surface of the N$^+$ diffusion region 34. Thus, the resistance of the semiconductor device 1C can be more flexibly changed compared to the semiconductor device 1B. Further, the silicide layer 28 may be provided when the diffusion region is P-type, i.e., the P$^+$ diffusion region 14 is disposed instead of the N$^+$ diffusion region 34.

Referring now to FIGS. 9A through 9D, a fabrication process of the semiconductor device 1C according to another exemplary embodiment is described.

The fabrication process of the semiconductor device 1C includes steps S301 through S311. FIGS. 9A through 9D illustrate the structure resulting from the steps S308 through S311, respectively. The steps S301 through S305 are performed in a similar manner as the steps S101 through S105 illustrated in FIGS. 5A through 5E. The steps S306 and S307 are performed in a similar manner as the steps S206 and S207 illustrated in FIGS. 7A and 7B.

With reference to FIG. 5A, in step S301, a silicon dioxide film 16 and a silicon nitride film 18 are formed over a main surface of the substrate 2. Then, an etch mask 20 such as photoresist is applied to the silicon nitride film 18 and patterned using a photolithographic technique to create a window.

With reference to FIG. 5B, in step S302, a rectangular cavity of a given depth is then formed in the substrate 2 by a dry etching technique. The etch mask 20 is subsequently removed.

With reference to FIG. 5C, in step S303, the rectangular cavity is filled with a silicon dioxide material 21 by a CVD process.

With reference to FIG. 5D, in step S304, the substrate 2 is planarized, for example, by a CMP process to form the isolation layer 12 in the rectangular cavity.

With reference to FIG. 5E, in step S305, a photoresist mask 22 is applied to the substrate 2 and patterned using a photolithographic technique. Then, phosphorus ions are implanted in the substrate 2 at a portion not covered with the photoresist mask 22. The implantation is performed with an energy of 490 KeV and a dose of $2*10^{13}$ A/cm$^2$, for example. The photoresist mask 22 is subsequently removed, and the N-type resistive region 4 is formed by heat treatment.

With reference to FIG. 7A, in step S306, a photoresist mask 36 is applied to the substrate 2 and patterned using a photolithographic technique. Then, arsenic ions are implanted in the substrate 2 at a portion not covered with the photoresist mask 36. The implantation is performed with an energy of 60 KeV and a dose of $4*10^{15}$ A/cm$^2$, for example.

With reference to FIG. 7B, in step S307, the photoresist mask 36 is subsequently removed. By performing heat treatment, the N$^+$ contact region 6 is formed at each end of the resistive region 4 and the N$^+$ diffusion region 34 is formed between the ends of the resistive region 4.

Figure 9A:
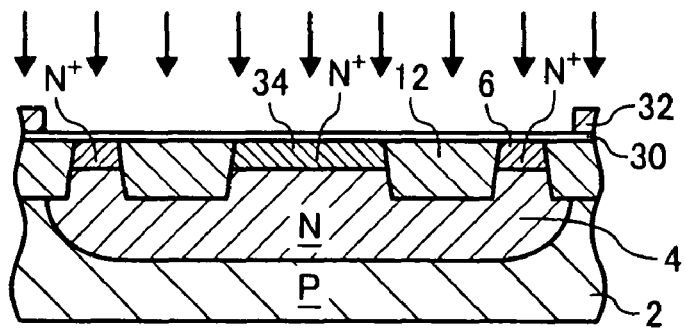
FIGS. 9A through 9D are cross-sectional views showing fabrication process of the semiconductor device of FIGS. 8A and 8B according to an exemplary embodiment of the present invention.

With reference to FIG. 9A, in step S308, a silicon dioxide film 30 is formed over the main surface of the substrate 2. Then, an etch mask 32 such as photoresist is applied to the silicon dioxide film 30 and patterned using a photolithographic technique to create a window over the contact region 6 and the diffusion region 34.

Figure 9B:
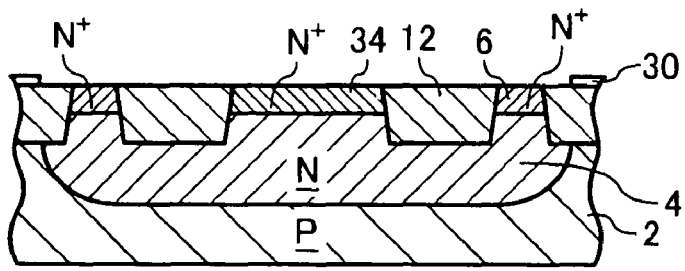

With reference to FIG. 9B, in step S309, a portion of the silicon dioxide film 30 exposed through the window is removed by an etching technique. The etch mask 32 is subsequently removed.

Figure 9C:
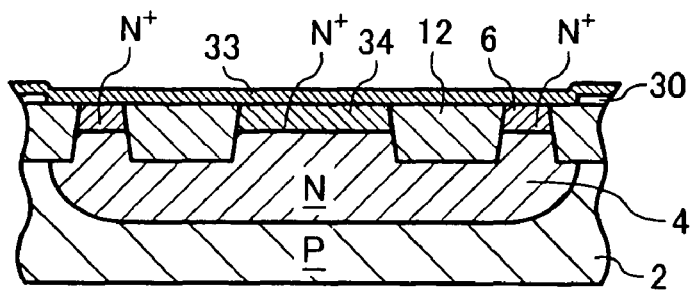

With reference to FIG. 9C, in step S310, a metal film 33 of high melting point material is formed over the main surface of the substrate 2. Examples of the material of the metal film 33 include any metal that can be used to form a silicide contact through self-aligned silicide or "salicide" process, such as cobalt, titanium, and nickel.

Figure 9D:
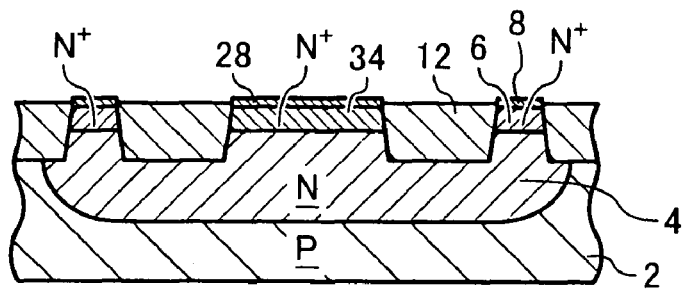

With reference to FIG. 9D, in step S311, heat treatment is performed to cause the metal film 33 to react with exposed silicon, forming the silicide layer 8 on the contact region 6 and the silicide layer 28 on the diffusion region 34. The metal film 33 and a residue of the silicon dioxide film 30 are subsequently removed.

Afterwards, the pair of contacts 10a and 10b are disposed on the silicide layer 8 to obtain the semiconductor device 1C of FIGS. 8A and 8B.

In the above fabrication process, formation of the silicide layer 28 as described in the steps S308 through S311 is performed in parallel with formation of the silicide layer 8. Alternatively, the silicide layer 8 and the silicide layer 28 may be formed through independent processes.

Additionally, in the above fabrication process, the isolation layer 12 may be produced by using a LOCOS technique instead of forming the STI structure using the CVD and CMP processes. However, the STI structure is preferable in order to make sure the dopant ions implanted after the formation of the isolation layer 12 (i.e., dopant ions for the contact region 6 and the $N^+$ diffusion region 34) are prevented from diffusing outward from a desired portion in the substrate 2.

Figure 10A:
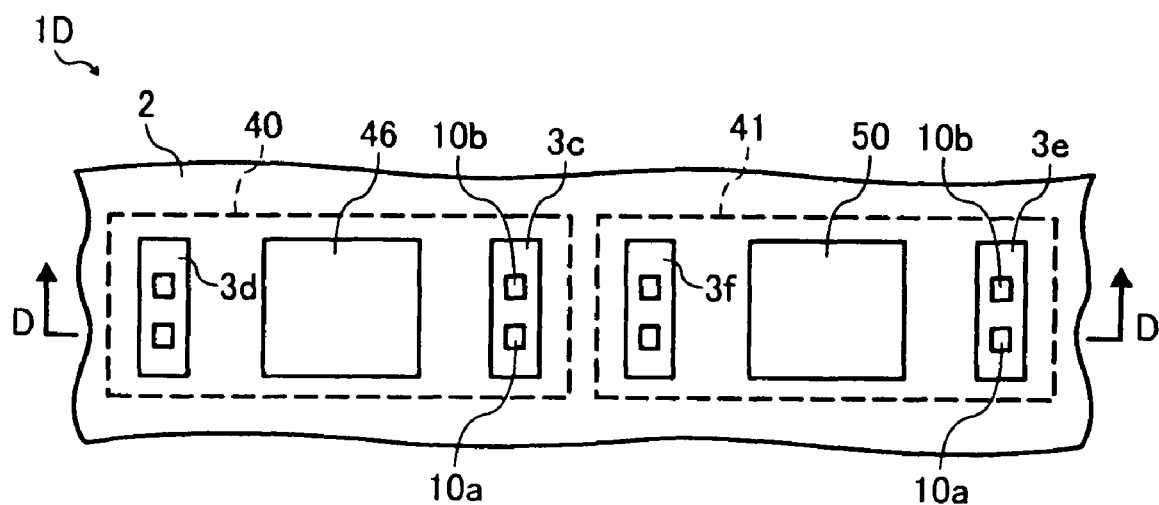
FIG. 10A is a plan view of a semiconductor device according to another exemplary embodiment.
Figure 10B:
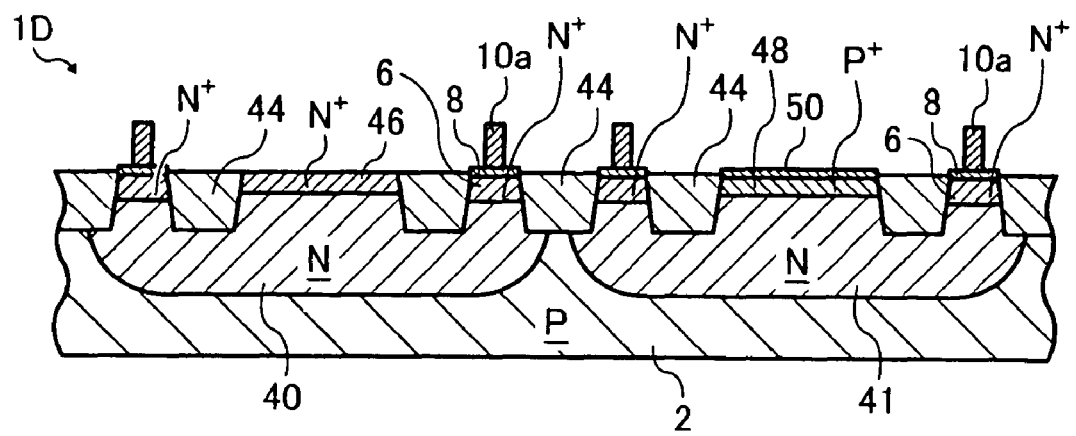
FIG. 10B is a cross-sectional view of the semiconductor device, of FIG. 10A, taken along line D-D.

Referring now to FIGS. 10A and 10B of the drawings, a schematic illustration of a semiconductor device 1D according to another exemplary embodiment is described. FIG. 10A shows a plan view of the semiconductor device 1D. FIG. 10B shows a cross-sectional view of the semiconductor device 1D taken along line D-D of FIG. 10A.

In FIGS. 10A and 10B, the semiconductor device 1D includes the substrate 2, a first resistive region 40, a second resistive region 41, and an isolation layer 44.

The first resistive region 40 includes a pair of side portions 3c and 3d, and a diffusion region 46. Each of the side portions 3c and 3d includes the contact region 6, the silicide layer 8, and the pair of contacts 10a and 10b.

The second resistive region 41 includes a pair of side portions 3e and 3f, a diffusion region 48, and a silicide layer 50. Each of the side portions 3e and 3f includes the contact region 6, the silicide layer 8, and the pair of contacts 10a and 10b.

In the semiconductor device 1C, the substrate 2 is P-type. The first and second resistive regions 40 and 41 are N-wells formed below a surface of the P-type substrate 2.

In the first resistive region 40, each of the side portions 3c and 3d is disposed adjacent to a corresponding end of the first resistive region 40, spaced from each other. The contact region 6 is an $N^+$ region. The pair of contacts 10a and 10b are formed of tungsten, for example, and disposed at the contact region 6 with the silicide layer 8 sandwiched therebetween. The diffusion region 46 is an $N^+$ region formed between the pair of side portions 3c and 3d.

In the second resistive region 41, each of the side portions 3e and 3f is disposed adjacent to a corresponding end of the second resistive region 41, spaced from each other. The contact region 6 is an $N^+$ region. The pair of contacts 10a and 10b are formed of tungsten, for example, and disposed at the contact region 6 with the silicide layer 8 sandwiched therebetween. The diffusion region 48 is a $P^+$ region formed between the pair of side portions 3e and 3f. A surface of the diffusion region 48 is covered with the silicide layer 50. The silicide layer 50 is formed by a reaction of silicon with cobalt, for example.

The semiconductor device 1D has an STI structure. Namely, the first and second resistive regions 40 and 41 are electrically isolated by the isolation layer 44 formed of silicon dioxide. The isolation layer 44 is deposited over the first and second resistive regions 40 and 41 and the substrate 2 except for areas corresponding to the pairs of side portions 3c, 3d and 3e, 3f and the diffusion regions 46 and 48. Alternatively, the isolation layer 44 may be formed by a LOCOS technique.

Referring now to FIGS. 11A through 11J, cross-sectional views showing fabrication process of the semiconductor device 1D according to an exemplary embodiment of the present specification are described.

The fabrication process of the semiconductor device 1D includes steps S401 through S410. FIGS. 11A through 11J illustrate the structure resulting from the steps S401 through S410, respectively.

Figure 11A:
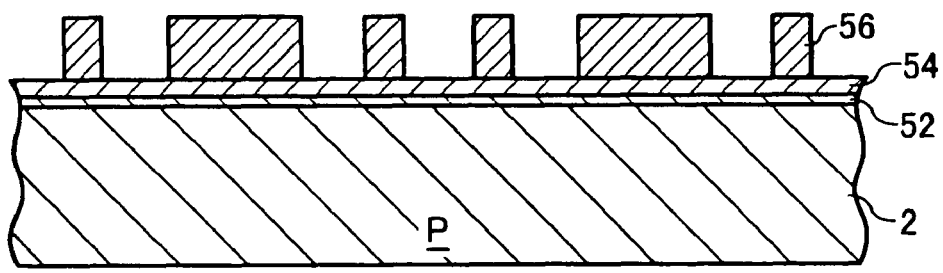
FIGS. 11A through 11J are cross-sectional views showing fabrication process of the semiconductor device of FIGS. 10A and 10B.

With reference to FIG. 11A, in step S401, a silicon dioxide film 52 and a silicon nitride film 54 are formed over a main surface of the substrate 2. Then, an etch mask 56 such as photoresist is applied to the silicon nitride film 54 and patterned using a photolithographic technique to create a window.

Figure 11B:
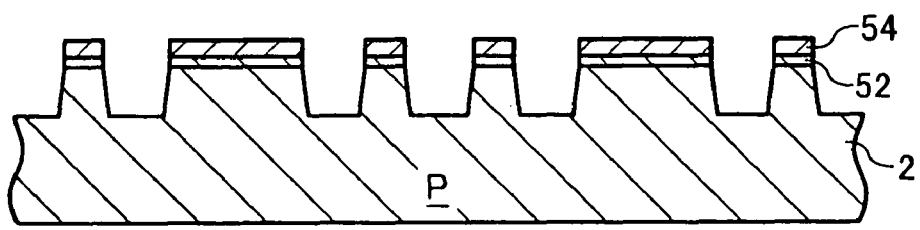

With reference to FIG. 11B, in step S402, a rectangular cavity of a given depth is then formed in the substrate 2 by a dry etching technique. The etch mask 56 is subsequently removed.

Figure 11C:
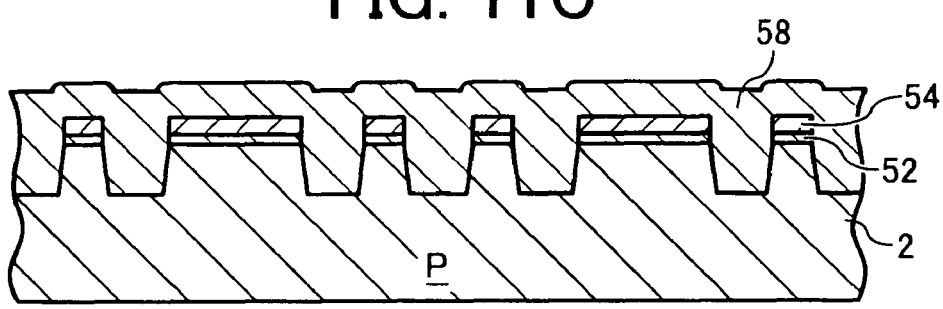

With reference to FIG. 11C, in step S403, the rectangular cavity is filled with a silicon dioxide material 58 by a CVD process.

Figure 11D:
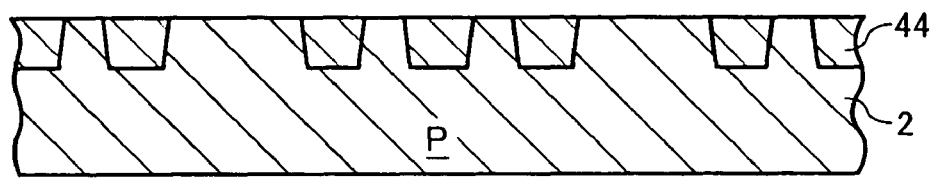

With reference to FIG. 11D, in step S404, the substrate 2 is planarized, for example, by a CMP process to form the isolation layer 44 in the rectangular cavity.

Figure 11E:
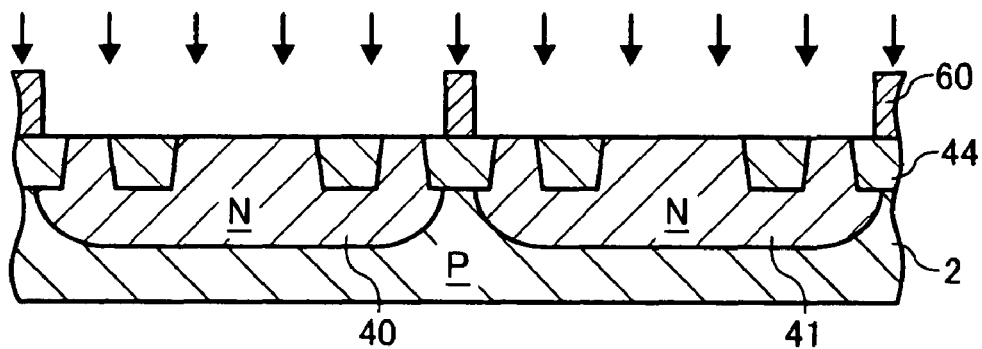

With reference to FIG. 11E, in step S405, a photoresist mask 60 is applied to the substrate 2 and patterned using a photolithographic technique. Then, phosphorus ions are implanted in the substrate 2 at a portion not covered with the photoresist mask 60. The implantation is performed with an energy of 490 KeV and a dose of $2*10^{13}$ $A/cm^2$, for example. The photoresist mask 60 is subsequently removed, and the N-type first and second resistive regions 40 and 41 are formed by heat treatment.

Figure 11F:
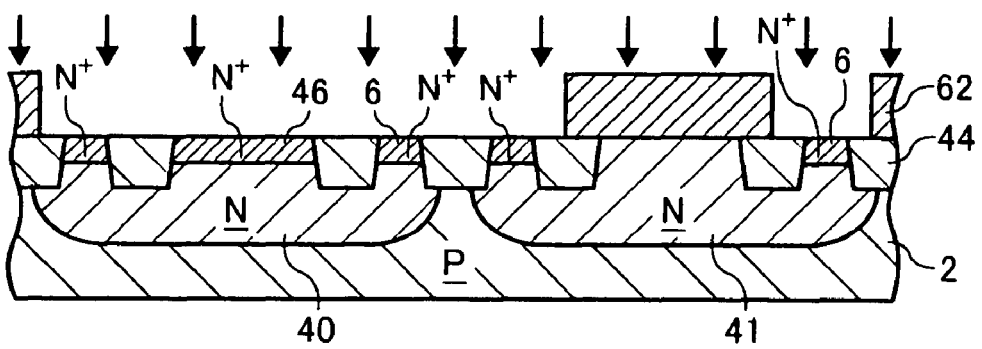

With reference to FIG. 11F, in step S406, a photoresist mask 62 is applied to the substrate 2 and patterned using a photolithographic technique. Then, arsenic ions are implanted in the substrate 2 at a portion not covered with the photoresist mask 62. The implantation is performed with an energy of 60 KeV and a dose of $4*10^{15}$ $A/cm^2$, for example. The photoresist mask 62 is subsequently removed. By performing heat treatment, the $N^+$ contact region 6 is formed at each end of the first and second resistive regions 40 and 41, and the $N^+$ diffusion region 46 is formed between the ends of the first resistive region 40.

Figure 11G:
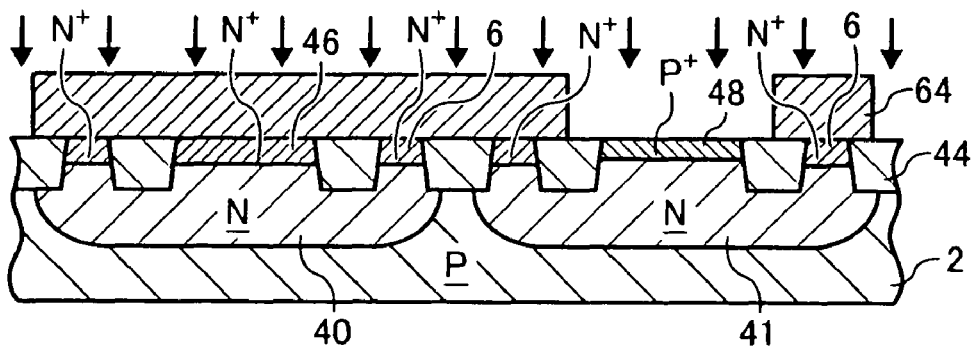

With reference to FIG. 11G, in step S407, a photoresist mask 64 is applied to the substrate 2 and patterned using a photolithographic technique. Then, dopant ions, e.g., boron ions are implanted in the substrate 2 at a portion not covered with the photoresist mask 64. The implantation is performed with an energy of 5 KeV and a dose of $2.5*10^{15}$ $A/cm^2$, for example. The photoresist mask 64 is subsequently removed. By performing heat treatment, the $P^+$ diffusion region 48 is formed between the ends of the second resistive region 41.

Figure 11H:
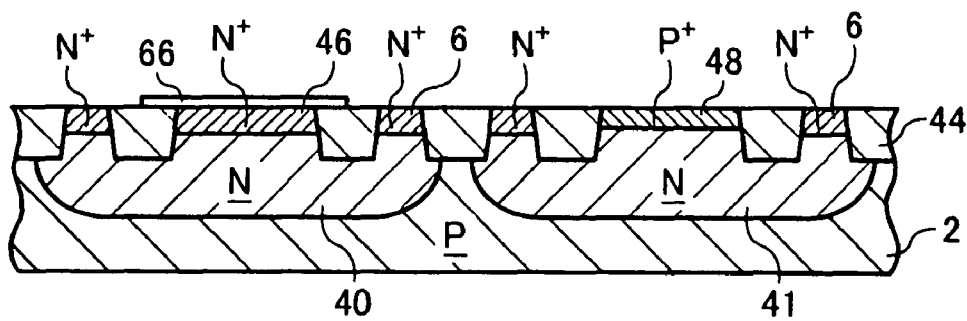

With reference to FIG. 11H, in step S408, a silicon dioxide film 66 is formed over the main surface of the substrate 2.

Then, an etch mask (not shown) such as photoresist is applied to the silicon dioxide film 66 and patterned using a photolithographic technique to create a window over the contact region 6 and the P$^+$ diffusion region 48. Then, a portion of the silicon dioxide film 66 exposed through the window is removed by an etching technique. The etch mask is subsequently removed.

Figure 11I:
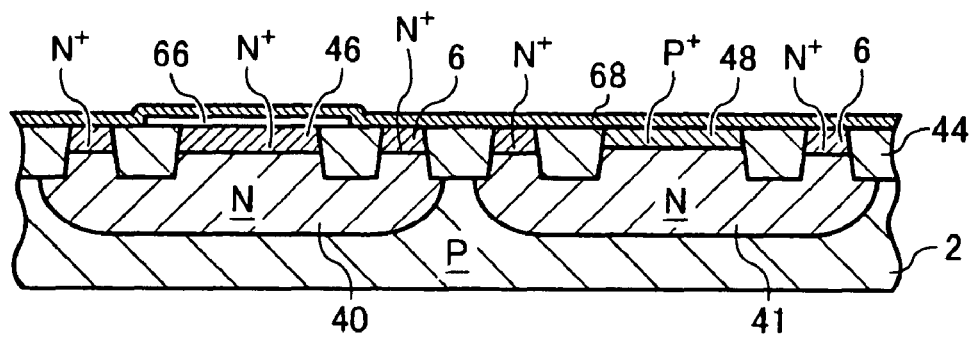

With reference to FIG. 11I, in step S409, a metal film 68 of high melting point material is formed over the main surface of the substrate 2. Examples of the material of the metal film 68 include any metal that can be used to form a silicide contact through self-aligned silicide or "salicide" process, such as cobalt, titanium, and nickel.

Figure 11J:
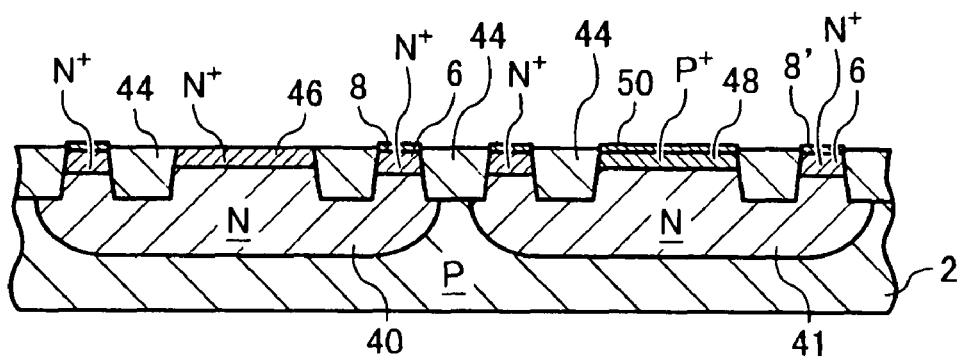

With reference to FIG. 11J, in step S410, heat treatment is performed to cause the metal film 68 to react with exposed silicon, forming the silicide layer 8 on the contact region 6 and the silicide layer 48 on the P$^+$ diffusion region 48. The metal film 68 and a residue of the silicon dioxide film 66 are subsequently removed.

Afterwards, the pair of contacts 10a and 10b are disposed on the silicide layer 8 to obtain the semiconductor device 1D of FIGS. 10A and 10B.

Some steps of the above fabrication process may be performed in tandem with processing of different components than the semiconductor device 1D. For example, the ion implantation of steps S406 and/or S407 may be performed in introducing ions to form a source and/or a drain of another component formed on the substrate 2 such as a complementary metal-oxide semiconductor (CMOS) transistor. Thereby, the above fabrication process can be performed without involving additional stages to an existing fabrication process of a semiconductor device.

Additionally, in the above fabrication process, the isolation layer 44 may be produced by using a LOCOS technique instead of forming the STI structure using the CVD and CMP processes. However, the STI structure is preferable in order to make sure the dopant ions implanted after the formation of the isolation layer 44 (i.e., dopant ions for the contact region 6 and the first and second diffusion regions 46 and 48) are prevented from diffusing outward from a desired portion in the substrate 2.

The semiconductor devices 1A through 1D as illustrated above can be used as a resistor in a current generating circuit.

Figure 12:
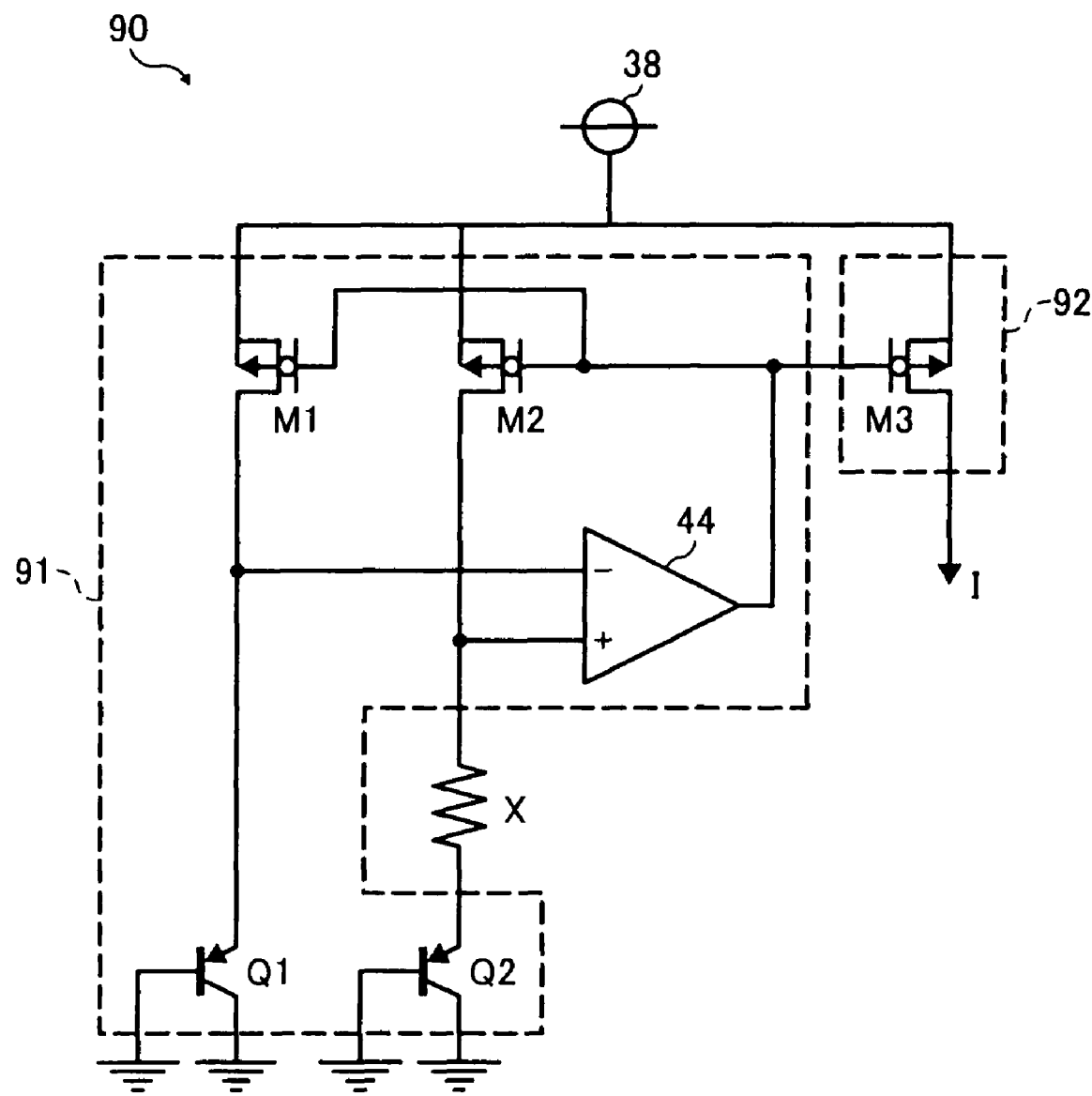
FIG. 12 is a diagram showing a constant current circuit of a current generating device according to an exemplary embodiment of this disclosure.

Referring now to FIG. 12, a constant current circuit 90 of a current generating device according to another exemplary embodiment is described.

In FIG. 12, the constant current circuit 90 includes a resistor X, a power supply terminal 38, a voltage generating part 91, and a current output part 92.

The voltage generating part 91 includes an operational amplifier 44 (hereinafter referred to as "op-amp 44"), metal-oxide semiconductor (MOS) transistors M1 and M2, and bipolar transistors Q1 and Q2.

The current output part 92 includes an MOS transistor M3.

The MOS transistors M1 through M3 have identical characteristics, and are connected as a current mirror with a common drain current substantially equal to a reference current I. The MOS transistors M1 through M3 have sources connected to a supply circuit (not shown) via the power supply terminal 38.

The MOS transistor M1 is grounded via the bipolar transistor Q1. The MOS transistor M2 is grounded via the resistor X and the bipolar transistor Q2.

The bipolar transistors Q1 and Q2 are basically identical in characteristics, except for different base-emitter junction areas. Each of the MOS transistors Q1 and Q2 has a base and a collector grounded.

The op-amp 44 has a negative, inverting input terminal and a positive, non-inverting input terminal. The inverting input terminal receives an input of electric potential derived from a base-emitter voltage of the bipolar transistor Q1. The non-inverting input terminal receives an input of electric potential derived from a base-emitter voltage of the bipolar transistor Q2 and a voltage applied across the resistor X.

In the constant current circuit 90, the voltage generating part 91 generates a voltage having a specific dependency on temperature variations. The voltage generated by the voltage generating part 91 is applied to each end of the resistor X. The current output part 92 outputs the reference current I in accordance with thermal properties of the generated voltage and the resistor X.

Specifically, the temperature coefficient TC(I) of the reference current I is represented by the following equation:

$$TC(I) = 1/I * \partial I / \partial T$$
$$= TC(V_t) + TC(1/R)$$
$$= TC(V_t) - TC(R),$$

where R represents resistance of the resistor X and $V_t$ represents thermal voltage given by kT/q with absolute temperature T (K), Boltzmann constant k=1.38*10$^{-13}$ (J/K), and elementary charge q=1.6*10$^{-19}$ (C).

According to the above equation, the temperature coefficient TC(I) of the reference current I is determined by a difference between the temperature coefficients TC(R) and TC($V_t$). A desired value of the temperature coefficient TC(I) can be obtained by suitably adjusting the temperature coefficient TC(R) of the resistor X.

For example, by adjusting the temperature coefficient TC(R) of the resistor X to be substantially equal to TC($V_t$), the temperature coefficient TC(I) of the reference current I can be reduced, causing the reference current I to be independent of temperature variations.

In the constant current circuit 90, any one of the semiconductor devices 1A through 1D can be used as the resistor X. The temperature coefficient TC(R) as well as the resistance is adjusted by varying the proportion of the diffusion region in the resistive region provided in each of the semiconductor devices 1A through 1D.

Figure 13A:
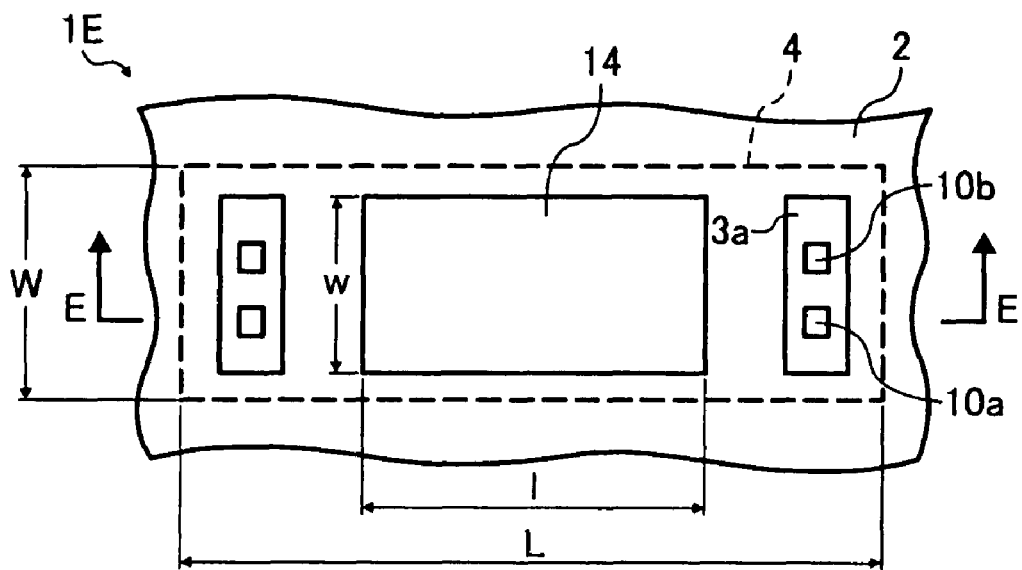
FIG. 13A is a plan view of a semiconductor device according to another exemplary embodiment.
Figure 13B:
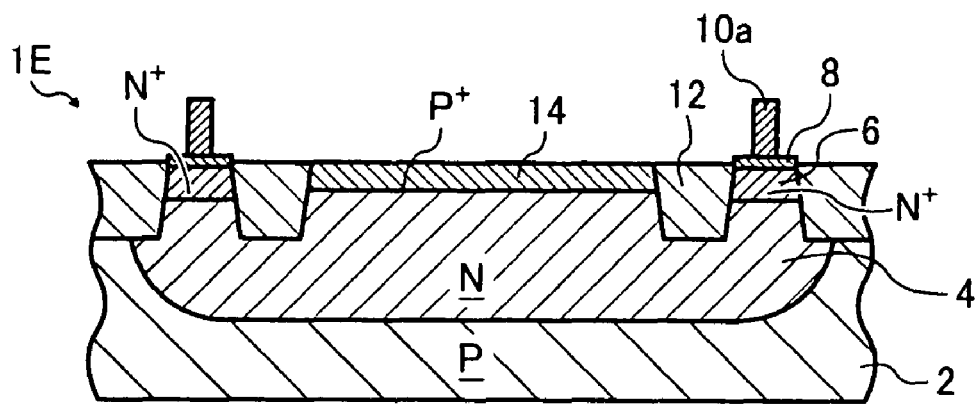
FIG. 13B is a cross-sectional view of the semiconductor device of FIG. 13A, taken along line E-E.

Referring to FIGS. 13A and 13B, a schematic illustration of a semiconductor device 1E according to another exemplary embodiment is described. FIG. 13A shows a plan view of the semiconductor device 1E. FIG. 13B shows a cross-sectional view of the semiconductor device 1E taken along line E-E of FIG. 13A.

The semiconductor device 1E includes the substrate 2, the resistive region 4, and the isolation layer 12, each of which is produced through the same fabrication process as the semiconductor device 1A. The semiconductor device 1E is used as the resistor X in the constant current circuit 90.

In FIG. 13A, the resistive region 4 has a length L (μm) and a width W (μm) and the P$^+$ diffusion region 14 has a length l (μm) and a width w (μm). Each of the length and width of the resistive region 4 and the P$^+$ diffusion region 14 can be changed to suitably adjust the resistance and temperature coefficient of resistance of the semiconductor device 1E.

Figure 14A:
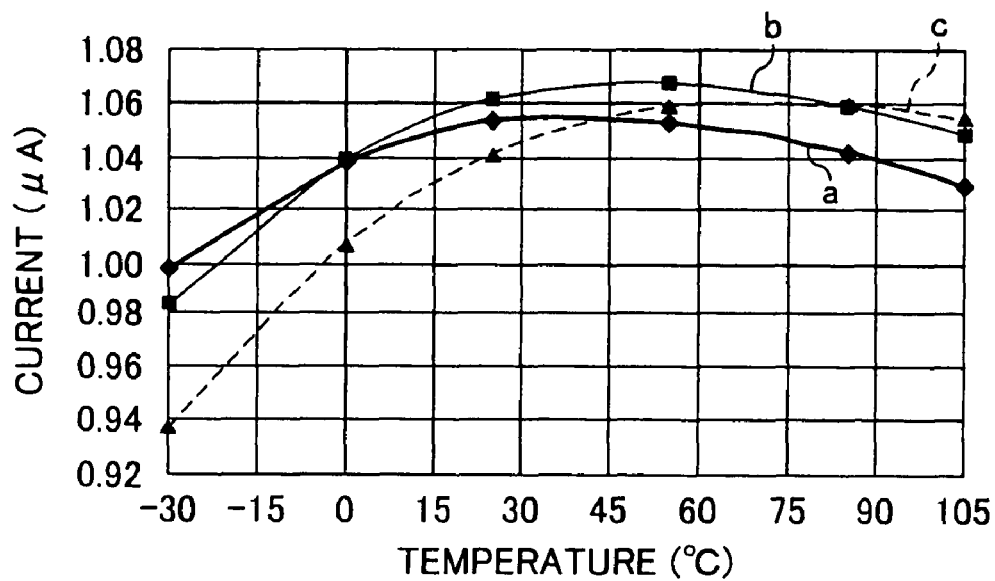
FIG. 14A is a line chart showing a relationship between temperature and reference current in the constant current circuit of FIG. 12.
Figure 14B:
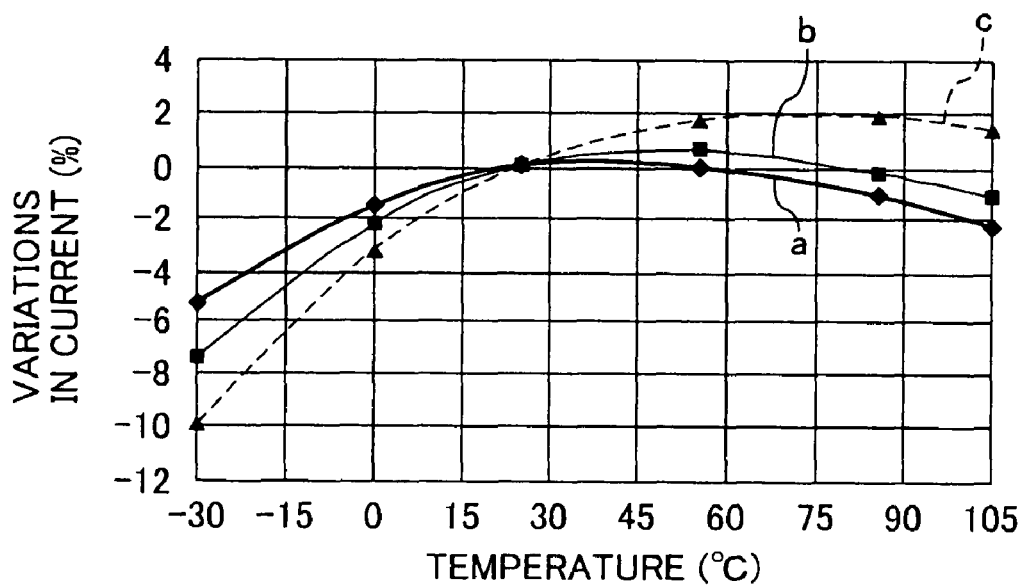
FIG. 14B is a line chart showing a relationship between temperature and variations in the reference current in the constant current circuit of FIG. 12.

Referring to FIGS. 14A and 14B, the thermal properties of the reference current I of the constant current circuit 90 using the semiconductor device 1E are illustrated.

FIG. 14A shows a relationship between the temperature and the reference current I in the constant current circuit 90.

The horizontal axis represents the temperature (° C.) and the vertical axis represents the reference current I (μA).

FIG. 14B shows a relationship between the temperature and variations in the reference current I in the constant current circuit 90. The horizontal axis represents the temperature (° C.) and the vertical axis represents variations (%) in the reference current I relative to an output current measured at 25° C.

In each of the line charts of FIGS. 14A and 14B, a graph "a" (bold solid line) and a graph "b" (solid line) each denotes values obtained by using the semiconductor device 1E with different lengths and widths of the resistive region 4 and the diffusion region 14. A graph "c" (dotted line) denotes values obtained by using a related art semiconductor device.

Specifically, the graph "a" represents values for the semiconductor device 1E with lengths and widths of the resistive region 4 and the diffusion region 14 of L=80 (μm), W=6 (μm) and l=70 (μm), w=4 (μm), respectively, having a temperature coefficient of resistance of 3963 ppm/° C. The graph "b" represents values for the semiconductor device 1E with lengths and widths of the resistive region 4 and the diffusion region 14 of L=75 (μm), W=6 (μm) and l=35 (μm), w=4 (μm), respectively, having a temperature coefficient of resistance of 3734 ppm/° C. The graph "c" represents values for the related art semiconductor device which is not provided with the diffusion region 14 and has a temperature coefficient of resistance of 3439 ppm/° C.

With reference to FIG. 14A, the graph "a" shows the reference current I varying within a range of 1 μA to 1.05 μA, the graph "b" shows the reference current I varying within a range of 0.99 μA to 1.07 μA, and the graph "c" shows the reference current I varying within a range of 0.94 μA to 1.06 μA.

With reference to FIG. 14B, the graph "a" shows the variations in the reference current I ranging from −5.5% to 0%, the graph "b" shows the variations in the reference current I ranging from −7.5% to +0.5%, and the graph "c" shows the variations in the reference current I ranging from −10% to +2%.

As shown in FIGS. 14A and 14B, the variations in the reference current I are effectively reduced by using the semiconductor device 1E having the diffusion region 14. In particular, it is shown that the effect of the diffusion region 14 becomes more significant as the proportion of the diffusion region 14 becomes large in the resistive region 4.

Figure 15A:
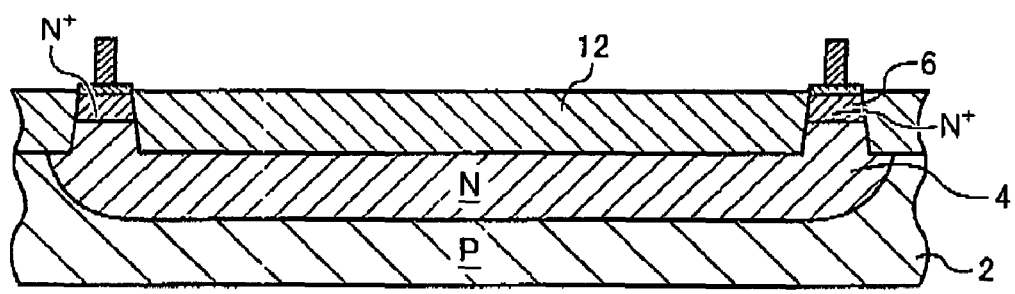
FIG. 15A is a cross-sectional view of an example of a semiconductor device.
Figure 15B:
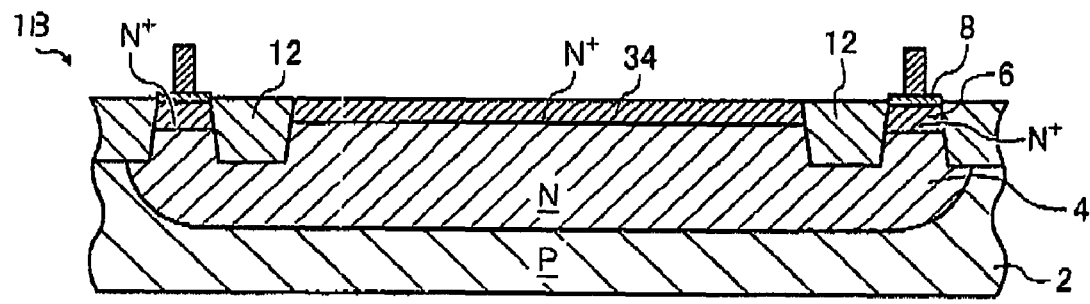
FIG. 15B is a cross-sectional view of a semiconductor device according to another example.
Figure 15C:
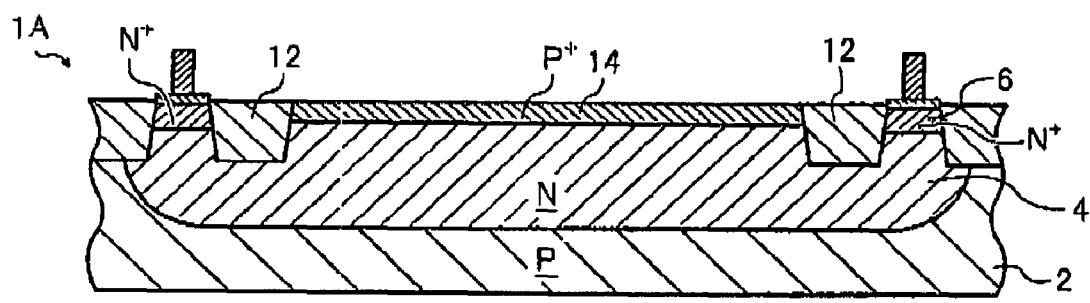
FIG. 15C is a cross-sectional view of a semiconductor device according to another example.
Figure 15D:
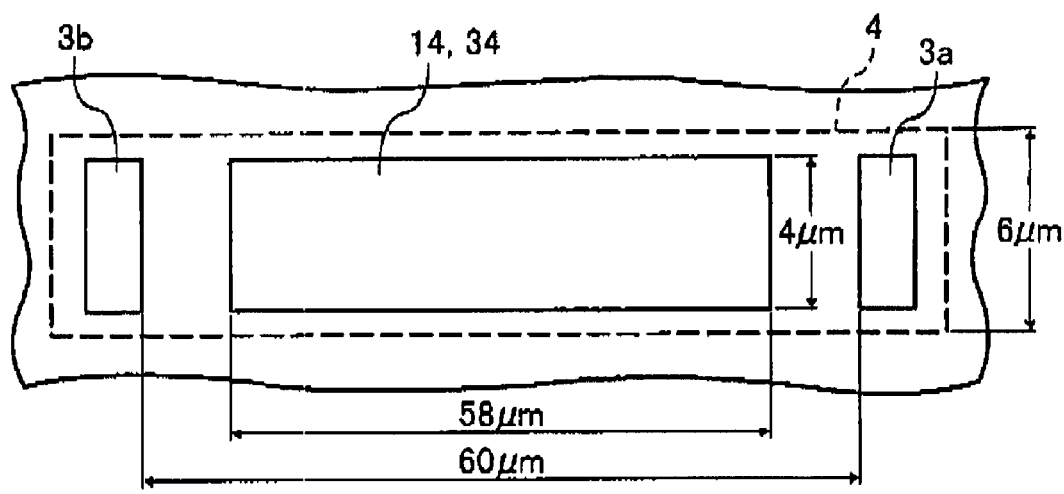
FIG. 15D is a layout for each of the semiconductor devices of FIGS. 15A through 15C.

Referring now to FIGS. 15A through 15D of the drawings, a schematic illustration of an example of the semiconductor device is described. FIG. 15A shows an example of a semiconductor device. FIG. 15B shows another example of the semiconductor device 1B. FIG. 15C shows another example of the semiconductor device 1A. FIG. 15D is a layout for each of the semiconductor devices of FIGS. 15A through 15C.

The semiconductor device of FIG. 15A is formed in a similar manner as the semiconductor devices 15B and 15C except that the diffusion region is not provided on the resistive region 4.

In FIGS. 15A through 15C, a width of the resistive region 4 is set to 6 μm and a length between the pair of side portions 3a and 3b is set to 60 μm. Each of the P⁺ and N⁺ diffusion regions 14 and 34 has a width of 4 μm and a length of 58 μm.

Each of the semiconductor devices of FIGS. 15A through 15C has the isolation layer 12 formed by an STI technique. As shown in FIGS. 15B and 15C, the isolation layer 12 has a bottom surface below the interface between the resistive region 4 and the diffusion region 14 or 34.

A test was conducted to evaluate the resistance and the temperature dependence of resistance (TCR) of the resistive region 4 for each of the semiconductor devices of FIGS. 15A through 15C. Table 1 provides results of the evaluation.

TABLE 1

Resistance and TCR for the semiconductor devices with STI structure

| SEMI-CONDUCTOR DEVICE | RESISTANCE (Ω) | | | | TCR (ppm/° C.) |
|---|---|---|---|---|---|
| | 25° C. | 85° C. | 105° C. | 125° C. | |
| NO DIFFUSION REGION | 18228.2 | 21635.7 | 23245.0 | 24764.7 | 3585.9 |
| N⁺ DIFFUSION REGION | 496.3 | 605.0 | 658.8 | 709.2 | 4290.8 |
| P⁺ DIFFUSION REGION | 4803.1 | 5810.6 | 6289.3 | 6756.8 | 4067.6 |

In Table 1, the first row, "NO DIFFUSION REGION", shows results for the semiconductor device of FIG. 15A, the second row, "N⁺ DIFFUSION REGION", shows results for the semiconductor device of FIG. 15B, and the third row, "P⁺ DIFFUSION REGION", shows results for the semiconductor device of FIG. 15C.

As shown in Table 1, the resistive region 4 of the semiconductor devices having the N⁺ or P⁺ diffusion region exhibited lower resistance than that of the semiconductor device having no additional diffusion region. Such an effect is due to the diffusion region and the isolation layer 12 provided with a bottom surface below the interface between the resistive region 4 and the diffusion region.

Further, it is also shown that with the isolation layer 12 of STI structure, the TCR for semiconductor devices having the N⁺ or P⁺ diffusion region is higher than the TCR for the semiconductor device having no additional diffusion region.

Figure 16A:
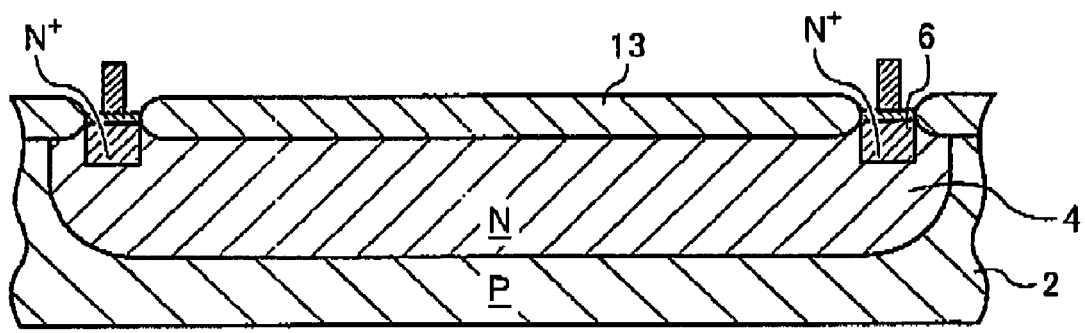
FIG. 16A is a cross-sectional view of another example of a semiconductor device.
Figure 16B:
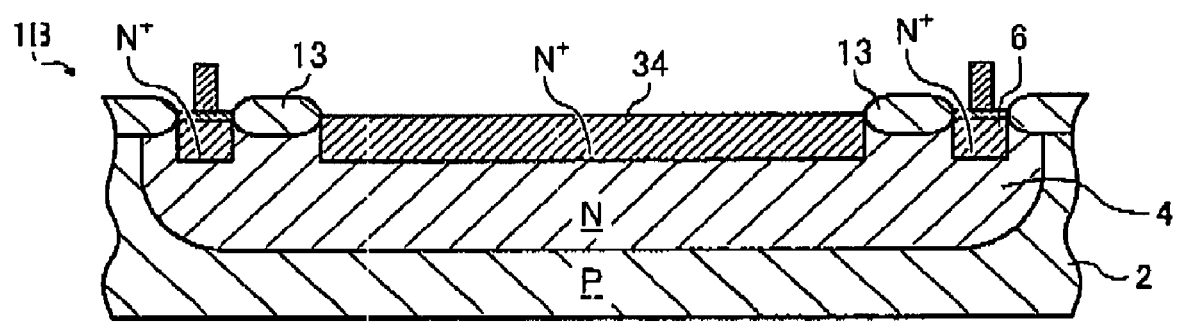
FIG. 16B is a cross-sectional view of a semiconductor device according to another example.
Figure 16C:
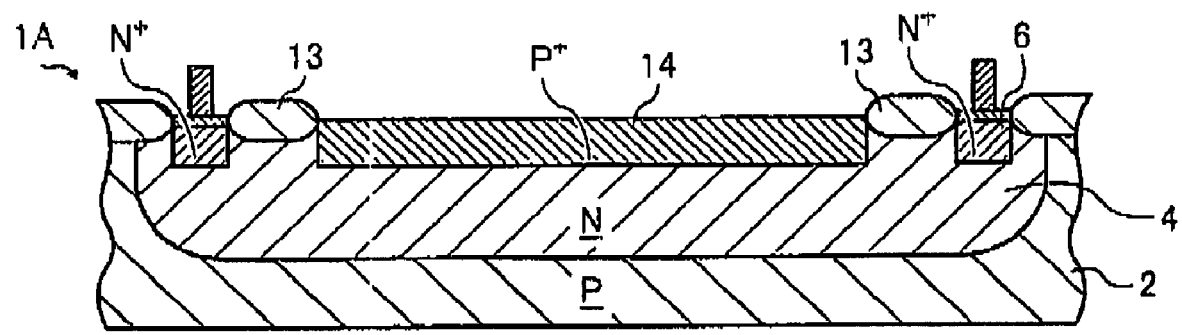
FIG. 16C is a cross-sectional view of a semiconductor device according to another example.
Figure 16D:
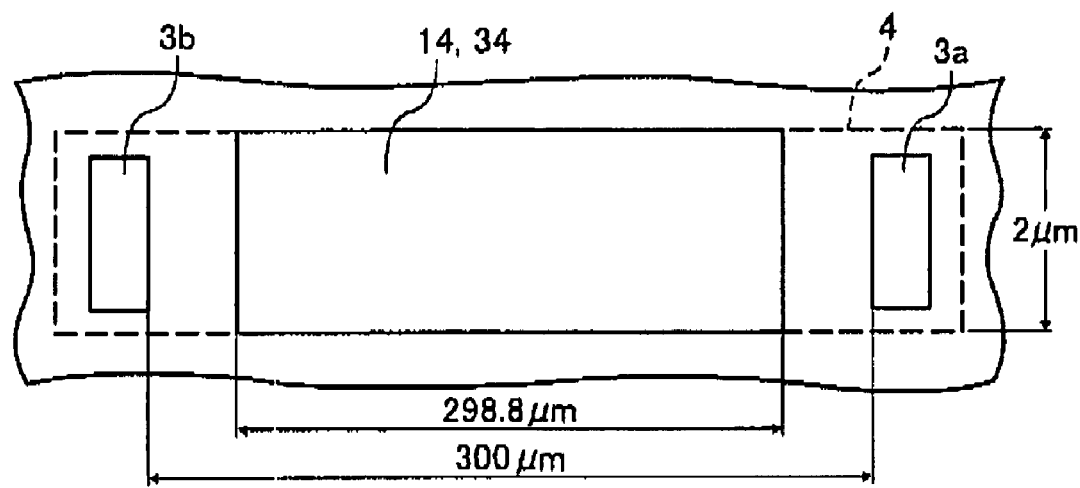
FIG. 16D is a layout for each of the semiconductor devices of FIGS. 16A through 16C.

Referring now to FIGS. 16A through 16D of the drawings, additional examples of the semiconductor device are described. FIG. 16A shows an example of a semiconductor device. FIG. 16B shows another example of the semiconductor device 1B. FIG. 16C shows another example of the semiconductor device 1A. FIG. 16D is a layout for each of the semiconductor devices of FIGS. 16A through 16C.

The semiconductor device of FIG. 16A is formed in a similar manner as the semiconductor devices 16B and 16C except that the diffusion region is not provided on the resistive region 4.

In FIGS. 16A through 16C, a width of the resistive region 4 is set to 2 μm and a length between the pair of side portions 3a and 3b is set to 300 μm. Each of the P⁺ and N⁺ diffusion regions 14 and 34 has a width of 2 μm and a length of 298.8 μm.

Each of the semiconductor devices of FIGS. 16A through 16C has the isolation layer 12 formed by an LOCOS technique. As shown in FIGS. 16B and 16C, the isolation layer 12 has a bottom surface above the interface between the resistive region 4 and the diffusion region 14 or 34.

A test was conducted to evaluate the resistance and the temperature dependence of resistance (TCR) of the resistive region 4 for each of the semiconductor devices of FIGS. 16A through 16C. Table 2 provides results of the evaluation.

TABLE 2

Resistance and TCR for the semiconductor devices with LOCOS structure

| SEMI-CONDUCTOR DEVICE | RESISTANCE (Ω) | | | | TCR (ppm/ °C.) |
|---|---|---|---|---|---|
| | 25° C. | 85° C. | 105° C. | 125° C. | |
| NO DIFFUSION REGION | 125015.6 | 167364.0 | 182182.5 | 199203.2 | 5934.3 |
| $N^+$ DIFFUSION REGION | 6868.1 | 7830.9 | 8110.3 | 8467.7 | 2328.5 |
| $P^+$ DIFFUSION REGION | 191754.6 | 254972.0 | 275710.0 | 300932.9 | 5693.7 |

In Table 2, the first row, "NO DIFFUSION REGION", shows results for the semiconductor device of FIG. 16A, the second row, "$N^+$ DIFFUSION REGION", shows results for the semiconductor device of FIG. 16B, and the third row, "$P^+$ DIFFUSION REGION", shows results for the semiconductor device of FIG. 16C.

As shown in Table 2, the resistive region 4 of the semiconductor devices having the $N^+$ or $P^+$ diffusion region exhibited higher resistance than that of the semiconductor device having no additional diffusion region. Such an effect is due to the diffusion region and the isolation layer 12 provided with a bottom surface above the interface between the resistive region 4 and the diffusion region. Namely, the depth of the resistive region 4 of FIGS. 16B and 16C, which substantially corresponds to the distance between the bottom sides of the diffusion region 14 or 34 and the resistive region 4, is reduced compared to the depth of the resistive region 4 of FIG. 16A.

Further, it is also shown that with the isolation layer 12 of LOCOS structure, the TCR for the semiconductor devices having the $N^+$ or $P^+$ diffusion region is smaller than the TCR for the semiconductor device having no additional diffusion region.

In general, when used as a resistor in a constant current circuit, the semiconductor device may preferably have a TCR value of approximately 4000 ppm/° C. To achieve a desired value of TCR, a semiconductor device having a higher TCR value (e.g., the semiconductor devices of FIGS. 16A and 16C) is used in conjunction with an additional well resistor having a smaller value of TCR, for example, a P-type well resistor with a TCR of 1700 ppm/° C.

For cases where the additional well resistor is provided, the additional well resistor can be reduced in size for the semiconductor device of FIG. 16C having the $P^+$ diffusion region 14 compared to the semiconductor device of FIG. 16A having no additional diffusion region.

Further, the semiconductor device of FIG. 16C achieves a higher value of resistance compared to the semiconductor device of FIG. 16A. With the semiconductor structure of FIG. 16C, the resistance of a semiconductor resistor can be increased without increasing the length of the semiconductor resistor, which results in a size reduction in the constant current circuit.

In the exemplary embodiments as described above, the substrate 2 is P-type and the resistive region 4 is N-type. However, the conductivity type of the components of the semiconductor devices 1A through 1E may be suitably selected in accordance with the intended purpose.

Numerous additional modifications and variations are possible in light of the above teachings. It is therefore to be understood that within the scope of the appended claims, the disclosure of this patent specification may be practiced otherwise than as specifically described herein.

This patent specification is based on Japanese patent application, No. JPAP 2006-162022 filed on Jun. 12, 2006 in the Japanese Patent Office, the entire contents of which are incorporated by reference herein.

What is claimed is:

1. A semiconductor resistor, comprising:
    a semiconductor substrate;
    a contiguous well region configured to serve as a resistive region provided in the semiconductor substrate;
    a pair of contact regions spaced apart from each other, and respectively in contact with the contiguous well region and having the same conductivity type as the contiguous well region;
    a contact disposed on each of the pair of contact regions;
    a diffusion region having a specific surface area configured to obtain a corresponding reduced resistance and increased temperature dependence of the contiguous well region, the diffusion region being formed in an intermediate portion between the pair of contact regions on a surface of the contiguous well region; and
    an isolation layer configured to electrically isolate said diffusion region from said pair of contact regions and the contacts disposed on each of the contact regions,
    wherein a surface of the semiconductor resistor is planarized, so that an upper surface of the diffusion region, an upper surface of the isolation layer, and an upper surface of the pair of contact regions in contact with the contiguous well region are in planar alignment on the surface of the semiconductor resistor.

2. The semiconductor resistor according to claim 1, wherein the diffusion region has a conductivity type opposite to the contiguous well region.

3. The semiconductor resistor according to claim 1, wherein the diffusion region has a conductivity type same as the contiguous well region.

4. The semiconductor resistor according to claim 1, wherein said isolation layer is disposed to cover the contiguous well region except for a portion corresponding to the pair of contact regions and the diffusion region.

5. The semiconductor resistor according to claim 4, wherein the isolation layer is provided by filling, with an insulation material, a cavity formed in the semiconductor substrate.

6. The semiconductor resistor according to claim 1, wherein a plurality of well regions each serving as a resistive region are provided in the semiconductor substrate, and at least one of the plurality of well regions includes the diffusion region.

7. A current generating device, comprising:
    a voltage generating part configured to generate a voltage having a specific dependency on temperature variations;
    a semiconductor resistor configured to receive the generated voltage at each end thereof, said semiconductor resistor including:
        a semiconductor substrate;
        a contiguous well region configured to serve as a resistive region provided in the semiconductor substrate;
        a pair of contact regions spaced apart from each other, and respectively in contact with the contiguous well region and having the same conductivity type as the contiguous well region;
        a contact disposed on each of the pair of contact regions;
        a diffusion region having a specific surface area configured to obtain a corresponding reduced resistance and increased temperature dependence of the contiguous well region, the diffusion region being formed in an intermediate portion between the pair of contact regions on a surface of the contiguous well region; and an isolation layer configured to electrically isolate said diffusion region from said pair of contact regions and the contacts disposed on each of the contact regions; and a current output part configured to output a current in accordance with thermal properties of the generated voltage and the semiconductor resistor, wherein a surface of the semiconductor resistor is planarized, so that an upper surface of the diffusion region, an upper surface of the isolation layer, and an upper surface of the pair of contact regions in contact with the contiguous well region are in planar alignment on the surface of the semiconductor resistor.

8. The semiconductor resistor of claim 1, wherein a silicide layer is disposed on each of said pair of contact regions, and the contacts are formed on the silicide layers.

9. The semiconductor resistor of claim 1, wherein said diffusion region causes a reduction in the resistance exhibited by the semiconductor resistor.

10. The semiconductor resistor of claim 1, wherein the resistance of said semiconductor resistor is adjusted by varying the proportion of the surface areas of said diffusion region to said resistive region.

11. The semiconductor resistor of claim 1, wherein said diffusion region causes an increase in the temperature dependence of the resistance of said resistive region.

12. The semiconductor resistor of claim 1, wherein the temperature dependence of the resistance of said resistive region is adjusted by varying the proportion of the surface areas of said diffusion region to said resistive region.

13. The semiconductor resistor of claim 1, wherein the specific surface area of the diffusion region is associated with the corresponding resistance that is reduced and the temperature dependence of the contiguous well region that is increased, as compared to a well region of a similar semiconductor resistor that does not include said diffusion region.

14. The semiconductor resistor of claim 1, wherein each of said contacts is only disposed on one of said pair of contact regions, and is not disposed on an upper surface of the diffusion region.

15. The semiconductor resistor of claim 1, wherein the diffusion region is not in direct physical contact with any of said pair of contact regions or any of said contacts.

16. The semiconductor resistor of claim 1, wherein a silicide layer is disposed on an upper surface of the diffusion region.

17. The semiconductor resistor of claim 1, wherein a bottom surface of the isolation layer that interfaces with the contiguous well region is a predetermined distance lower than a bottom surface of the diffusion region that interfaces with the contiguous well region.

18. The semiconductor resistor of claim 1, wherein the contiguous well region includes a plurality of well region columns extending vertically upward from the surface of the contiguous well region, and the pair of contact regions are disposed on a first and second one of the plurality of well region columns spaced apart from each other in the contiguous well region, the diffusion region is formed on a third one of the plurality of well region columns in an intermediate portion between the first and second one of the plurality of well region columns of the contiguous well region, and the isolation layer is disposed between each of the plurality of well region columns.

19. The semiconductor resistor of claim 1, wherein when a voltage is applied across the contact regions spaced apart from each other in the contiguous well region, the applied voltage encounters a resistance exhibited by the contiguous well region.

* * * * *